US010077886B2

(12) United States Patent
Ouderkirk et al.

(10) Patent No.: US 10,077,886 B2
(45) Date of Patent: Sep. 18, 2018

(54) HYBRID LIGHT BULBS USING COMBINATIONS OF REMOTE PHOSPHOR LEDS AND DIRECT EMITTING LEDS

(71) Applicant: 3M INNOVATIVE PROPERTIES COMPANY, St. Paul, MN (US)

(72) Inventors: Andrew J. Ouderkirk, St. Paul, MN (US); Erin A. McDowell, St. Paul, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 517 days.

(21) Appl. No.: 14/402,039

(22) PCT Filed: May 2, 2013

(86) PCT No.: PCT/US2013/039272
§ 371 (c)(1),
(2) Date: Nov. 18, 2014

(87) PCT Pub. No.: WO2013/180890
PCT Pub. Date: Dec. 5, 2013

(65) Prior Publication Data
US 2015/0131259 A1 May 14, 2015

Related U.S. Application Data

(60) Provisional application No. 61/654,278, filed on Jun. 1, 2012.

(51) Int. Cl.
*F21V 9/16* (2006.01)
*F21V 13/08* (2006.01)
(Continued)

(52) U.S. Cl.
CPC ............ *F21V 13/08* (2013.01); *F21K 9/64* (2016.08); *H01L 25/0753* (2013.01);
(Continued)

(58) Field of Classification Search
CPC .... F21K 9/64; F21Y 2113/10; F21Y 2113/13; F21Y 2113/17
See application file for complete search history.

(56) References Cited

U.S. PATENT DOCUMENTS 5,882,774 A 3/1999 Jonza
6,783,349 B2 8/2004 Neavin
(Continued)

FOREIGN PATENT DOCUMENTS

DE 102007059548 4/2009
EP 2455990 5/2012
(Continued)

OTHER PUBLICATIONS

Search Report for Taiwan Appl. No. 102117448, dated Dec. 30, 2016, 1 pg.
(Continued)

*Primary Examiner* — Sean Gramling
(74) *Attorney, Agent, or Firm* — Gregg H. Rosenblatt

(57) ABSTRACT

A light source suitable for general lighting applications combines at least one remote phosphor LED and at least one direct emitting LED in a single unit. Both the remote phosphor LED and the direct emitting LED are carried by a base and covered by a bulb or other suitable cover member, which may be light-diffusing. The remote phosphor LED includes a first LED, a phosphor layer, and a first dichroic reflector. Excitation light from the first LED is reflected by the first dichroic reflector onto the phosphor layer to generate phosphor light, which is substantially transmitted by the first dichroic reflector. At least some light from the direct emitting LED propagates to the cover member without passing through any dichroic reflector, including the first dichroic reflector. The light source may provide white light output using relatively small amounts of phosphor material.

19 Claims, 12 Drawing Sheets

(51) Int. Cl.
*H01L 25/075* (2006.01)
*H01L 33/46* (2010.01)
*F21K 9/64* (2016.01)
*H01L 33/50* (2010.01)
*H01L 33/60* (2010.01)
*F21V 7/22* (2018.01)
*F21V 13/12* (2006.01)
*F21Y 115/10* (2016.01)
*F21Y 113/13* (2016.01)
*F21Y 113/17* (2016.01)

(52) U.S. Cl.
CPC ............ *H01L 33/46* (2013.01); *F21V 7/22* (2013.01); *F21V 13/12* (2013.01); *F21Y 2113/13* (2016.08); *F21Y 2113/17* (2016.08); *F21Y 2115/10* (2016.08); *H01L 33/50* (2013.01); *H01L 33/60* (2013.01); *H01L 2924/0002* (2013.01)

(56) References Cited

U.S. PATENT DOCUMENTS

| | | | |
|---|---|---|---|
| 7,091,653 | B2 | 8/2006 | Ouderkirk |
| 7,394,188 | B2 | 7/2008 | Ouderkirk |
| 1,064,036 | A1 | 5/2013 | Greep |
| 2004/0145913 | A1* | 7/2004 | Ouderkirk ............... H01L 33/46 362/555 |
| 2004/0150991 | A1 | 8/2004 | Ouderkirk et al. |
| 2006/0245188 | A1 | 11/2006 | Takenaka |
| 2007/0024191 | A1 | 2/2007 | Chen |
| 2007/0120089 | A1 | 5/2007 | Mao |
| 2008/0106887 | A1 | 5/2008 | Salsbury |
| 2008/0211386 | A1 | 9/2008 | Choi |
| 2008/0237614 | A1 | 10/2008 | Ishikura et al. |
| 2009/0316383 | A1 | 12/2009 | Son |
| 2010/0177497 | A1* | 7/2010 | Leung .................. F21V 7/0008 362/84 |
| 2011/0188228 | A1 | 8/2011 | Li |
| 2011/0227469 | A1 | 9/2011 | Yuan |
| 2011/0267800 | A1 | 11/2011 | Tong |
| 2013/0154519 | A1* | 6/2013 | Riesebosch ......... H01L 25/0753 315/312 |

FOREIGN PATENT DOCUMENTS

| | | |
|---|---|---|
| JP | 2007-088348 A | 4/2007 |
| JP | 2008-288412 A | 11/2008 |
| JP | 2009-049000 | 3/2009 |
| KR | 2008-0059989 | 7/2008 |
| KR | 10-1064036 | 9/2011 |
| WO | WO 2004/068597 | 8/2004 |
| WO | WO 2009-052329 | 4/2009 |
| WO | WO 2009-128004 | 10/2009 |
| WO | WO 2011/097379 | 8/2011 |
| WO | WO 2011-109093 | 9/2011 |
| WO | WO 2011-109098 | 9/2011 |
| WO | WO 2011-109099 | 9/2011 |
| WO | WO 2012-061010 | 5/2012 |
| WO | WO 2012-091971 | 7/2012 |
| WO | WO 2012-091973 | 7/2012 |
| WO | WO 2012-091975 | 7/2012 |
| WO | WO 2013-055412 | 4/2013 |

OTHER PUBLICATIONS

Zhu, "Investigation of Remote-Phosphor White Light-Emitting Diodes with Multi-Phosphor Layers", Japanese Journal of Applied Physics, 2010, vol. 49, pp. 100203-1-100203-3.
International Search Report for PCT International Application No. PCT/US2013/039272 dated Sep. 25, 2013, 3 pages.

* cited by examiner

HYBRID LIGHT BULBS USING COMBINATIONS OF REMOTE PHOSPHOR LEDS AND DIRECT EMITTING LEDS

FIELD OF THE INVENTION

This invention relates generally to light sources, with particular application to solid state light sources that incorporate a light emitting diode (LED) and a phosphor. The invention also relates to associated articles, systems, and methods.

BACKGROUND

Solid state light sources that emit broadband light are known. In some cases, such light sources are made by applying a layer of yellow-emitting phosphor onto a blue LED. As light from the blue LED passes through the phosphor layer, some of the blue light is absorbed, and a substantial portion of the absorbed energy is re-emitted by the phosphor as Stokes-shifted light at longer wavelengths in the visible spectrum, typically, yellow light. The phosphor thickness is small enough so that some of the blue LED light passes all the way through the phosphor layer, and combines with the yellow light from the phosphor to provide broadband output light having a white appearance.

Other LED-pumped phosphor light sources have also been proposed. In U.S. Pat. No. 7,091,653 (Ouderkirk et al.), a light source is discussed in which ultraviolet (UV) light from an LED is reflected by a long-pass reflector onto a phosphor layer. The phosphor layer emits visible (preferably white) light, which light is substantially transmitted by the long-pass reflector. The LED, phosphor layer, and long-pass filter are arranged in such a way that as UV light travels from the LED to the long-pass reflector it does not pass through the phosphor layer.

BRIEF SUMMARY

We have developed a new family of broadband solid state light sources. These light sources, which can be made for use as light bulbs in general lighting applications, combines at least one remote phosphor LED and at least one direct emitting LED in a single "hybrid" unit. Both the remote phosphor LED and the direct emitting LED are carried by a base and covered by a bulb or other suitable cover member, which may be light-diffusing. The remote phosphor LED includes a first LED, a phosphor layer, and a first dichroic reflector. Excitation light from the first LED is reflected by the first dichroic reflector onto the phosphor layer to generate phosphor light, which is substantially transmitted by the first dichroic reflector. At least some light from the direct emitting LED propagates to the cover member without passing through any dichroic reflector, including the first dichroic reflector. The light source may provide white light output using relatively small amounts of phosphor material.

We describe herein, inter alia, hybrid light sources that emit broadband output light, and that include a base, a light-transmissive cover member attached to the base, a first LED, a second LED, a first phosphor layer, and a first dichroic reflector carried by the base and covered by the cover member. The first dichroic reflector is configured to reflect at least some excitation light from the first LED onto the first phosphor layer to cause the first phosphor layer to emit first phosphor light. The first dichroic reflector is also configured to substantially transmit the first phosphor light. The second LED is disposed to emit at least some light that propagates from the second LED to the cover member without passing through any dichroic reflector, including the first dichroic reflector. The source may also include a controller configured to control the first and second LEDs with first and second drive signals respectively.

The first LED, the first phosphor layer, and the first dichroic reflector may be arranged such that the at least some excitation light propagates from the first LED to the first dichroic reflector without passing through the first phosphor layer. The broadband output light emitted by the light source may be substantially white in appearance to an ordinary observer. The first LED may emit light having a peak wavelength from 340 to 480 nm, or from 400 to 470 nm.

The second LED may be one of a plurality of non-pump LEDs. The non-pump LEDs may include a blue-emitting LED having a peak wavelength in a range from 445 to 500 nm, and a red-emitting LED having a peak wavelength in a range from 600 to 650 nm.

The cover member may be light-diffusing, and may be concave. The first dichroic reflector may be concave, and may cover both the first LED and the first phosphor layer. The broadband output light emitted by the light source may be substantially white and have a color rendering index of at least 80.

The first LED may be one of a plurality of pump LEDs. Further, the first phosphor layer may be one of a plurality of phosphor layers, and the first dichroic reflector may be one of a plurality of dichroic reflectors. Each of the dichroic reflectors may be configured to reflect excitation light from at least one of the pump LEDs onto a corresponding one of the phosphor layers. The pump LEDs may each have a major emitting surface with a major emitting surface area, a sum of the major emitting surface areas being a collective LED surface area ALED. Further, the phosphor layers may each have a major surface upon which light is incident, a sum of the phosphor incident surface areas being a collective phosphor surface area Aphosphor. The ratio Aphosphor/ALED may be no more than 50, or 20, or 15, or 10, or 5, or 2.

We also describe methods that include providing a first LED, a second LED, and a first phosphor layer, and arranging a first dichroic reflector to intercept at least some excitation light from the first LED, and to reflect such excitation light onto the first phosphor layer to cause the first phosphor layer to emit first phosphor light. The methods may also include substantially transmitting the first phosphor light through the first dichroic reflector, and combining the first phosphor light transmitted through the first dichroic reflector with LED light emitted by the second LED that has not passed through any dichroic reflector including the first dichroic reflector, to provide broadband output light.

In the method, the providing step may include providing a plurality of pump LEDs, the plurality of pump LEDs including the first LED and a third LED. In some cases, the first dichroic reflector may be also arranged to intercept at least some excitation light from the third LED, and to reflect such excitation light onto the first phosphor layer to cause the first phosphor layer to emit more of the first phosphor light. The providing may also include providing a second phosphor layer, and the method may further include arranging a second dichroic reflector to intercept at least some excitation light from the third LED, and to reflect such excitation light onto the second phosphor layer to cause the second phosphor layer to emit second phosphor light. The combining may include combining the second phosphor light transmitted through the second dichroic reflector with the first phosphor light transmitted through the first dichroic reflector, and with the LED light emitted by the second LED that has not passed through any dichroic reflector, to provide the broadband output light.

The providing the second LED may include providing a plurality of non-pump LEDs, the plurality of non-pump LEDs including the second LED and a fourth LED, and the broadband output light may also include LED light emitted by the fourth LED that has not passed through any dichroic reflector.

Related methods, systems, and articles are also discussed.

These and other aspects of the present application will be apparent from the detailed description below. In no event, however, should the above summaries be construed as limitations on the claimed subject matter, which subject matter is defined solely by the attached claims, as may be amended during prosecution.

BRIEF DESCRIPTION OF DRAWINGS

In the figures, like reference numerals designate like elements.

DETAILED DESCRIPTION OF ILLUSTRATIVE EMBODIMENTS

Figure 1:
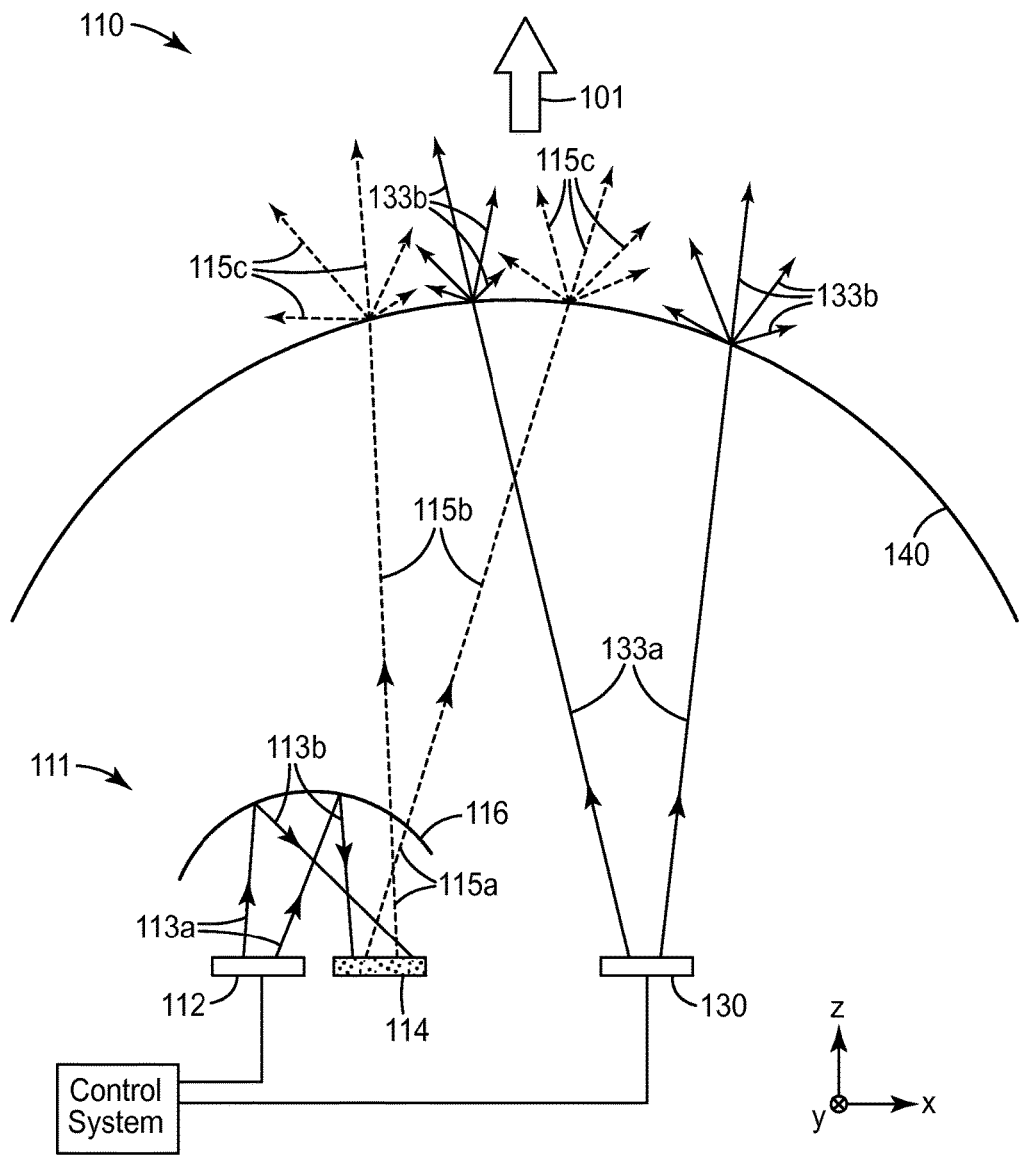
FIG. 1 is a schematic side- or cross-sectional view of a broadband light source that combines a remote phosphor LED and a direct emitting LED.

We have found that broadband solid state light sources with particularly beneficial design features can be constructed by combining the light output of one or more remote phosphor LEDs and the light output of one or more direct emitting LEDs. The resulting hybrid light sources may have a robust solid state design, and may make efficient use of LEDs and phosphor materials. The light sources may also provide a white light output, with desirable characteristics such as a high color rendering index (CRI). The light sources can be used as light bulbs in general lighting applications, or can be used in other more specialized applications.

In this application, "light emitting diode" or "LED" refers to a diode that emits light, whether visible, ultraviolet, or infrared, although in many practical embodiments the emitted light will have a peak wavelength in a range from about 340 to 650 nm, or from about 400 to 650 nm. The term LED includes incoherent encased or encapsulated semiconductor devices marketed as "LEDs", whether of the conventional or super radiant variety, as well as coherent semiconductor devices such as laser diodes, including but not limited to vertical cavity surface emitting lasers (VCSELs). An "LED die" is an LED in its most basic form, i.e., in the form of an individual component or chip made by semiconductor processing procedures. For example, the LED die may be formed from a combination of one or more Group III elements and of one or more Group V elements (III-V semiconductor). Examples of suitable III-V semiconductor materials include nitrides, such as gallium nitride, and phosphides, such as indium gallium phosphide. Other types of III-V materials can also be used, as well as inorganic materials from other groups of the periodic table. The component or chip can include electrical contacts suitable for application of power to energize the device. Examples include wire bonding, tape automated bonding (TAB), or flip-chip bonding. The individual layers and other functional elements of the component or chip are typically formed on the wafer scale, and the finished wafer can then be diced into individual piece parts to yield a multiplicity of LED dies. The LED die may be configured for surface mount, chip-on-board, or other known mounting configurations. Some packaged LEDs are made by forming a polymer encapsulant over an LED die and an associated reflector cup. The LED may be grown on one of several substrates. For example, GaN LEDs may be grown by epitaxy on sapphire, silicon, and gallium nitride. An "LED" for purposes of this application should also be considered to include organic light emitting diodes, commonly referred to as OLEDs.

An LED that is used to excite or "pump" a separate phosphor material may be referred to herein as a "pump LED". The phosphor absorbs some or all of the light emitted by the pump LED, and re-emits some of the absorbed energy as Stokes-shifted (longer wavelength) phosphor light. For purposes of the present application, the phosphor light is typically substantially within the visible wavelength range, and the excitation light from the pump LED is typically at or near the short wavelength end of the visible light spectrum (e.g. blue-green, blue, or violet), or in the near ultraviolet. An LED not used to excite or pump a separate phosphor material may be referred to herein as a "non-pump LED". The term "remote phosphor LED", as used herein, refers to a subsystem that includes: at least one pump LED; at least one phosphor layer or body that is effectively structurally separated from the pump LED but optically coupled thereto; and a dichroic reflector that substantially reflects light from the pump LED to the phosphor and substantially transmits the Stokes-shifted phosphor light. Preferably, these components are arranged such that the excitation light propagates from the pump LED to the dichroic reflector without passing through the phosphor layer.

FIG. 1 shows in rough schematic form an exemplary broadband solid state light source 110. The source 110 includes a remote phosphor LED 111, a direct emitting LED 130, and a light-transmissive cover member 140. Mounting structures and other components (not shown) are used to hold the labeled components in fixed spatial positions with respect to each other so as to produce a desired broadband output light 101.

The remote phosphor LED 111 is a lighting subsystem that includes at least one pump LED 112, at least one phosphor layer 114, and a dichroic reflector 116. The pump LED 112 emits light 113a capable of exciting the phosphor.

Only two rays of the excitation light 113a are shown in the figure, but the reader will understand that the LED ordinarily emits excitation light over a wide range of directions (e.g. in a Lambertian distribution), and over a band of wavelengths. The excitation light 113a is typically at or near the short wavelength end of the visible light spectrum, or in the near ultraviolet. For example, the excitation light may have a peak wavelength in a range from 340 to 480 nm, or from 400 to 470 nm. Although only one pump LED 112 is shown in the figure, more than one may be included in a given remote phosphor LED subsystem as discussed elsewhere herein. The excitation light 113a is substantially reflected by the dichroic reflector 116 as reflected excitation light 113b.

The remote phosphor LED 111 also includes a phosphor layer 114, which is effectively structurally separated from, but optically coupled to, the pump LED 112. The phosphor layer 114 absorbs some or all of the incident (reflected) excitation light 113b, and re-emits some of the absorbed energy as longer wavelength phosphor light 115a. The phosphor light 115a is typically emitted by the phosphor material in all directions, and such light is itself typically broadband as discussed further below. Some of the phosphor light 115a propagates towards the dichroic reflector 116. Such light is substantially transmitted by the reflector 116 to produce transmitted phosphor light 115b. In some cases, the reflector 116 may also transmit some (typically a minor portion) of the excitation light 113a. The transmitted phosphor light 115b, as well as any light from the pump LED 112 that is transmitted through the dichroic reflector 116, then propagates onward to the cover member 140, where is transmitted, optionally with a desired degree of haze or scatter as illustrated, as phosphor light 115c.

The dichroic reflector 116 may in some cases conform to the outer surface of a lens member, which is not shown in FIG. 1 for generality but is shown in other figures herein. The dichroic reflector 116 and the outer lens surface (if present) may have a concave and/or curved shape, so that the light emitted by the pump LED 112, and reflected by the reflector 116, is directed predominantly onto the phosphor layer 114. The dichroic reflector may be shaped to form at least an approximate image of the pump LED 112 at or in the vicinity of the phosphor layer 114, e.g., to maximize efficiency by maximizing the amount of reflected excitation light that impinges on, and/or is actually absorbed by, the phosphor layer 114.

Dichroic reflectors are also sometimes referred to as dichroic mirrors or dichroic filters. They are designed to have a high reflectivity and low transmission for some optical wavelengths, and a low reflectivity and high transmission for other optical wavelengths. Such reflectors ordinarily have negligible absorption, such that any light that is not reflected is substantially transmitted, and vice versa, at least over visible, near infrared, and near-ultraviolet wavelengths. Such reflectors comprise stacks of optically thin microlayers, typically in an alternating arrangement of materials having a large refractive index mismatch, such as alternating layers of silicon dioxide and titanium dioxide, but other suitable inorganic or organic materials may also be used. Such reflectors may be made by vacuum deposition of the alternating layers on a glass or other suitable substrate, e.g., directly on the outer surface of a lens member, or on a film or substrate that can be subsequently applied to such a surface. Alternatively, suitable reflective films may be made by a continuous process that may involve coextrusion of alternating polymer materials and stretching the resulting multilayer polymer web, e.g. as described in U.S. Pat. No. 5,882,774 (Jonza et al.) and U.S. Pat. No. 6,783,349 (Neavin et al.). Regardless of the materials used in the dichroic reflector and the method of manufacture used, the reflector is provided with a layer thickness profile for the stack of microlayers that is tailored to provide the desired reflection characteristics as a function of wavelength. The thickness profile may be tailored to provide a dichroic reflector that operates as a long pass filter or a notch filter, for example, whereby relatively long wavelength phosphor light is substantially transmitted over a range of incidence angles, and relatively short wavelength LED excitation light is predominantly reflected. The dichroic reflector may for example have a transmission of at least 50%, or at least 60%, or at least 70% for the phosphor light. The dichroic reflector may in some cases substantially reflect visible blue light and substantially transmit visible magenta light. In some cases the dichroic reflector may be or comprise a multilayer mirror film, a reflective polarizer, and/or a partially polarizing reflector such as a mirror that, at a given wavelength, reflects orthogonal polarization states differently.

The reflective and transmissive properties of a dichroic reflector typically change as the incidence angle of light impinging on the reflector changes. For example, the dichroic reflector 116 may have a greater transmission for LED light rays that are obliquely incident on the reflector compared to LED light rays that are normally incident on the reflector. This characteristic may be used to produce a remote phosphor solid state light source whose output color can be adjusted by controlling the relative drive strengths of multiple LEDs arranged beneath the lens assembly, as discussed more fully in commonly assigned pending PCT Patent Publ. No. WO 2012/091973.

The phosphor layer 114 contains one or more suitable phosphor materials that fluoresce or otherwise emit light that is Stokes shifted relative to the absorbed LED light. The phosphor material preferably absorbs light in a range that overlaps in wavelength with the emission spectrum of the LED, such that the LED can excite the phosphor and cause it to fluoresce or otherwise emit phosphor light. In many cases, a given phosphor material may absorb light in the ultraviolet, blue, and/or blue-green portion of the electromagnetic spectrum, and may emit light in the visible or near-visible region. The emitted phosphor light is typically broadband, e.g., it may have a spectral width of at least 100 nanometers. The broadband phosphor light may be distributed in a continuous broad band, or it may have a spiked distribution as in the case of a collection of spaced-apart narrow emission lines, or it may be a combination of narrow emission lines and a continuous broad band. Exemplary phosphor materials include known fluorescent dyes and phosphors. Cerium-doped yttrium aluminum garnet (Ce: YAG) is one example of a phosphor that may be used. Other rare-earth doped garnets or other rare-earth doped materials may also be suitable, e.g., europium- and/or strontium-doped silicates, nitrides, and aluminates, depending on design details and constraints of the light source. Suitable phosphor materials may include organic and inorganic fluorescent or phosphorescent materials, such as doped inorganic oxides or nitrides, quantum dots, and semiconductors including II-VI and III-V materials.

The phosphor layers disclosed herein may be or comprise a layer of light-transmissive binder or matrix material in which is dispersed one or more types of fluorescent particles, e.g. rare-earth doped garnets or other fluorescent materials mentioned herein, in desired concentrations. The binder or matrix material may be organic or inorganic. Silicone is one example of a suitable binder material. Alternatively, ceramics may be used as binder materials. An advantage of using ceramics is substantially greater thermal conductivity than materials such as silicone. The greater thermal conductivity provides the phosphor layer as a whole with a greater thermal conductivity, which can be used in connection with a heat sink to maintain the phosphor layer at a lower operating temperature for improved efficiency.

In another aspect, the phosphor layer 114 may comprise a patterned phosphor. This patterned phosphor can include two or more phosphors of differing emission bands. In one aspect, phosphor layer 114 can include multiple patterned phosphors spatially separated from one another. The patterns can comprise singular areas with one color each, formed as stripes, raster patterns, or any other aligned pattern. In one example, phosphor layer 114 can include a green phosphor first portion/pattern and a red phosphor second portion/pattern. As these phosphor portions are separated, re-absorption or Stokes shift-related efficiency losses can be reduced. The portions/patterns can be separated via a space or structure (e.g., a wall) disposed between the different phosphor patterns. Patterning can be accomplished via conventional procedures, such as ink jet printing. Alternatively, the different phosphor layer portions/patterns can be touching or overlapping in certain regions.

The remote phosphor LED 111 may also include a broadband reflector (not shown in FIG. 1) beneath or behind the phosphor layer 114. At least some excitation light may pass through the phosphor layer 114 before reaching the broadband reflector. The broadband reflector preferably provides high reflectivity for both the LED excitation light and the longer wavelength phosphor light. The degree of transparency or of transmission of the phosphor layer to LED light can be tailored to increase the broadband light output of the lighting system. Such increase can actually be achieved by decreasing the amount of phosphor used in the phosphor layer. The single pass transmission of the phosphor layer to the LED light may be from 30 to 65%, and the reflectivity of the broadband reflector may be at least 90, 94, or 98%. Further details are provided in commonly assigned pending PCT Patent Publ. No. WO 2012/091975.

In addition to the remote phosphor LED 111, the source 110 also includes a direct emitting LED 130. We refer to the LED 130 as direct emitting because light 133*a* emitted by this LED is not predominantly used to pump a phosphor layer. Rather, such LED light 133*a* propagates from the LED 130 to the cover member 140 without passing through any dichroic reflector, including the dichroic reflector 116. Note that LEDs typically emit light over a wide angular range, and, therefore, depending on the design details of the dichroic reflector 116 and the phosphor layer 114, and their orientation relative to the LED 130, a small amount of LED light 133*a* may impinge upon the phosphor layer 114 and produce a very small amount of fluorescence. The LED 133*a* may nevertheless be referred to as a non-pump LED or direct emitting LED because a substantial majority of its emitted LED light propagates from the LED 130 to the cover member 140 without passing through any dichroic reflector and without producing fluorescence in any separate phosphor material.

Similar to the transmitted phosphor light 115*b*, the LED light 133*a* propagates onward to the cover member 140, where is transmitted, optionally with a desired degree of haze or scatter as illustrated, as transmitted LED light 133*b*. The transmitted LED light 133*b*, the transmitted phosphor light 115*c*, and any excitation light transmitted through the dichroic reflector 116 and the cover member 140, combine to produce the broadband output light 101 of the source 110. The output light 101 is shown schematically in the figure as a single arrow, but the reader will understand that the output light 101 is distributed over a wide range of directions, e.g., in a Lambertian or near-Lambertian distribution. The output light 101 may or may not be symmetrical about an optical axis of the source 110, e.g., an axis parallel to the z-axis of a Cartesian x-y-z coordinate system. The spectral distribution of the transmitted phosphor light 115*c* differs from that of the transmitted LED light 133*b*, and since these light components are combined in the output light 101, the output light 101 typically has a spectral distribution that is greater than that of either component individually.

The output light 101 is broadband, e.g., it may have a spectral width of at least 100, or 150, or 200, or 250 nanometers. The output light 101 may be distributed spectrally in a continuous broad band, or it may have a spiked distribution as in the case of a collection of spaced-apart narrow emission lines, or it may be a combination of narrow emission lines and a continuous broad band. In exemplary embodiments, the output light 101 has the appearance to an ordinary observer of substantially white light. CIE chromaticity coordinates, composed of a CIE x color coordinate and a CIE y color coordinate, characterize a mathematically defined color space that was developed by the Commission international de l'eclairage ("CIE", or International Commission on Illumination) in 1931. The x and y color coordinates should not be confused with x and y coordinates associated with physical position or displacement. Unlike the physical coordinates, the (x,y) chromaticity coordinates are unitless. For purposes of this application, one may define white light as light whose CIE color coordinates (x,y) satisfy $0.25 \leq x \leq 0.45$ and $0.25 \leq y \leq 0.45$, with different points within that defined region corresponding to different shades or hues of white light, e.g., warm (reddish) white vs. cool (blueish) white.

By appropriate selection of the direct emitting LED and the remote phosphor LED, it is possible to provide a light source 110 that provides broadband light (e.g. white light) more efficiently than if only remote phosphor LEDs were used, or if only direct emitting LEDs were used. LED technology and phosphor technology has been evolving and will continue to evolve. With existing or later-developed technology, it may be most efficient: to produce light of one particular wavelength band or color (e.g. red light) with a direct emitting LED, rather than a remote phosphor LED; and to produce light of a different particular wavelength band or color (e.g. green light) with a remote phosphor LED (using for example a high efficiency blue or UV pump LED in combination with a green-emitting phosphor), rather than a direct emitting LED. By combining the most efficient producers of the constituent components (colors) of the broadband (e.g. white) output light in a single source, the overall efficiency of the source can be maximized or optimized.

The cover member 140 may be made of glass, plastic, or other suitable light-transmissive material. The cover member 140 may be in the form of a bulb, such as any of the known bulbs used in conventional light bulbs for general lighting. In this regard, some or substantially all of the space between the cover member 140 and the remote phosphor LED 111 and the direct emitting LED 130 may be air, or an inert gas, or vacuum. Alternatively, such space may be partially or completely filled with a solid, liquid, or otherwise tangible light-transmissive material. The cover member may be made of only one layer or optical element, or it may comprise a plurality of layers or optical elements, e.g., an outer bulb that encloses a smaller inner bulb. The cover member 140 may be "frosted", i.e., adapted to scatter light, or it may be clear with little or no light scattering. The bulb may also attach to a base member that is compatible with conventional light fixtures, e.g., the base member may be threaded or otherwise adapted to mate with existing lighting sockets, and may have electrical contacts as needed and suitable circuitry to convert residential or commercial electrical service voltage levels to voltages and currents that are compatible with LEDs. The source 110 may also couple to a control system (see FIG. 1) that energizes the various LEDs in the source 110, or such a control system may be included as a component within the source 110.

Turning now to FIGS. 2a-2d, 3, and 4, we provide in connection with these figures further information relating to suitable remote phosphor LEDs. Reference is also made to the following commonly assigned PCT publications, which describe various types of remote phosphor LEDs that may be used in, or readily adapted for use in, the presently disclosed light sources: WO 2012/091971; WO 2012/091973; WO 2013/055412; and WO 2012/091975.

Figure 2A:
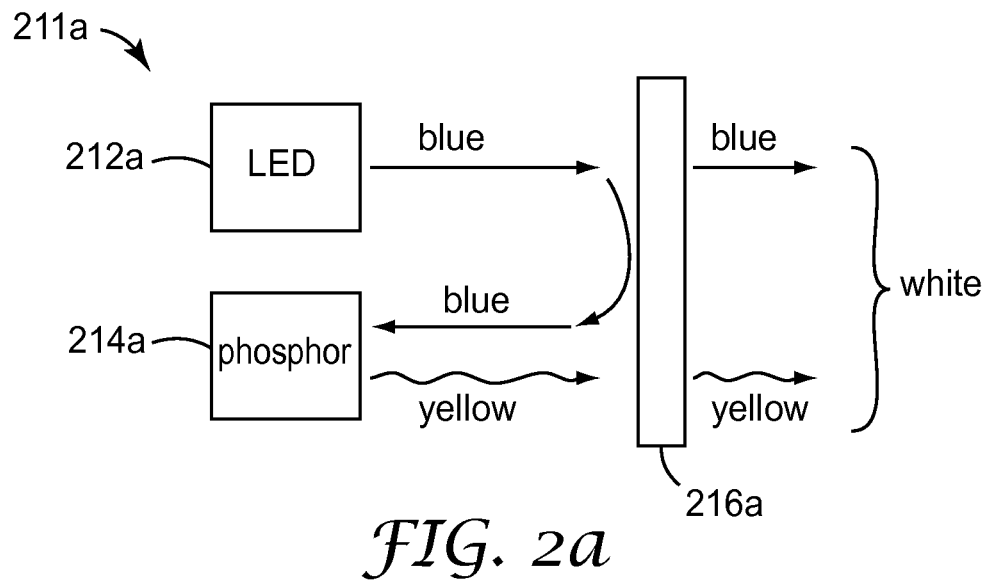
FIGS. 2a through 2d are functional diagrams that demonstrate some different color or wavelength combinations that can be used in a given remote phosphor LED.

Several different color or wavelength combinations that can be used in a given remote phosphor LED are shown schematically in FIGS. 2a through 2d. These figures and their descriptions should be considered to be exemplary and not limiting. In FIG. 2a, a remote phosphor LED 211a includes a pump LED 212a that emits visible blue excitation light, most of which is reflected and preferably imaged onto a phosphor layer 214a by a dichroic reflector 216a. The phosphor layer emits phosphor light of a particular color, e.g., yellow. The color yellow is only exemplary, and other phosphor light of colors may also be used. The yellow phosphor light is substantially transmitted by the dichroic reflector 216a. In this embodiment, the dichroic reflector is assumed to have a significant transmission for the excitation light from the pump LED 212a. Although the transmission may be significant, it is typically less than 50% e.g., less than 40, 30, 20, or 10%, and the reflectivity for the excitation light is typically greater than 50%, e.g., at least 60, 70, 80, or 90%. In any case, some of the blue excitation light is transmitted through the dichroic reflector 216a, and combines with the yellow phosphor light to provide a white light output for the remote phosphor LED 211a. If the yellow phosphor light is replaced with phosphor light of a different color, the output of the remote phosphor LED 211a will have a non-white color.

Figure 2B:
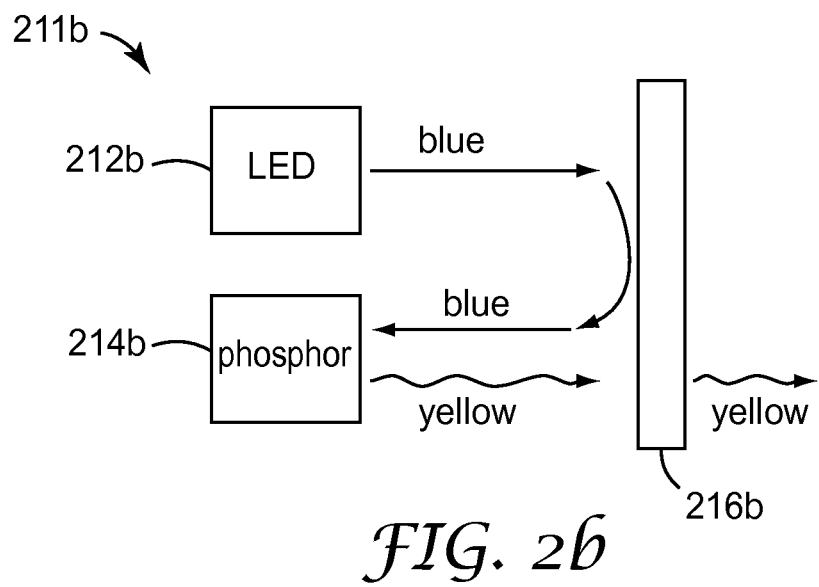

In FIG. 2b, a remote phosphor LED 211b includes a pump LED 212b that emits visible blue excitation light, most or all of which is reflected and preferably imaged onto a phosphor layer 214b by a dichroic reflector 216b. The phosphor layer emits phosphor light of a particular color, e.g., yellow. The color yellow is only exemplary, and other phosphor light of colors may also be used. The yellow phosphor light is substantially transmitted by the dichroic reflector 216b. In this embodiment, the dichroic reflector is assumed to have little or no transmission for the excitation light from the pump LED 212b. Therefore, little or none of the blue excitation light is transmitted through the dichroic reflector 216b. The yellow phosphor light, by itself, provides the light output for the remote phosphor LED 211b. If the yellow phosphor light is replaced with phosphor light of a different color, the output of the remote phosphor LED 211b will have an output of such different color.

Figure 2C:
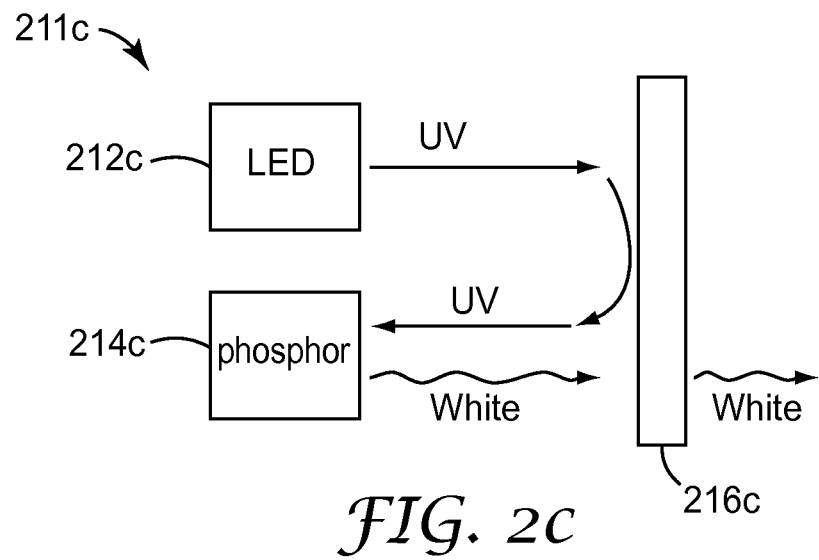

In FIG. 2c, a remote phosphor LED 211c includes a pump LED 212c that emits ultraviolet (UV) excitation light, most or all of which is reflected and preferably imaged onto a phosphor layer 214c by a dichroic reflector 216c. The phosphor layer emits white phosphor light. The white phosphor light is substantially transmitted by the dichroic reflector 216c. In this embodiment, the dichroic reflector is assumed to have little or no transmission for the excitation light from the pump LED 212c. Therefore, little or none of the UV excitation light is transmitted through the dichroic reflector 216c. The white phosphor light, by itself, provides the light output for the remote phosphor LED 211c.

Figure 2D:
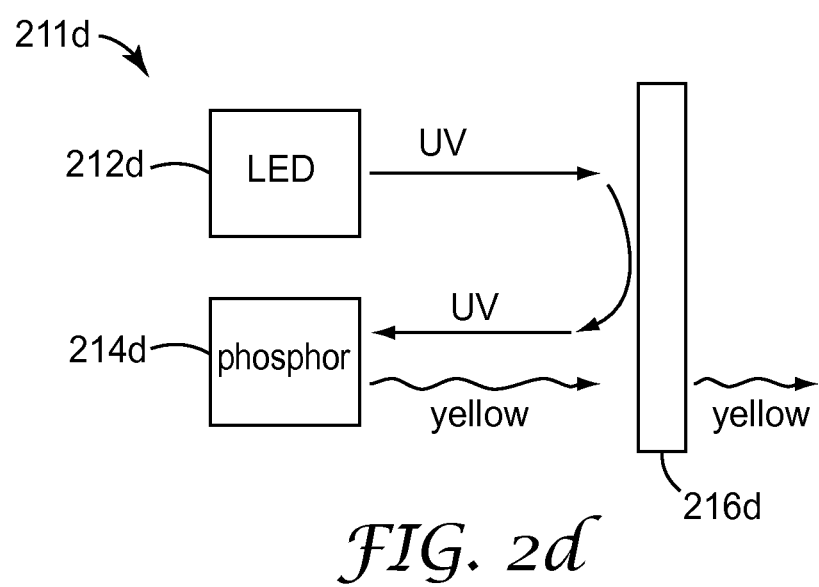

FIG. 2d shows a remote phosphor LED 211d similar to that of FIG. 2c, except that the phosphor layer emits light of a particular non-white color, e.g., yellow. Thus, a remote phosphor LED 211d includes a pump LED 212d that emits UV excitation light, most or all of which is reflected and preferably imaged onto a phosphor layer 214d by a dichroic reflector 216d. The phosphor layer emits phosphor light of a particular non-white color, e.g., yellow. The color yellow is only exemplary, and other phosphor light of colors may also be used. The yellow phosphor light is substantially transmitted by the dichroic reflector 216d. In this embodiment, the dichroic reflector is assumed to have little or no transmission for the excitation light from the pump LED 212d. Therefore, little or none of the UV excitation light is transmitted through the dichroic reflector 216d. The yellow phosphor light, by itself, provides the light output for the remote phosphor LED 211d. If the yellow phosphor light is replaced with phosphor light of a different color, the output of the remote phosphor LED 211d will have an output of such different color.

Figure 3:
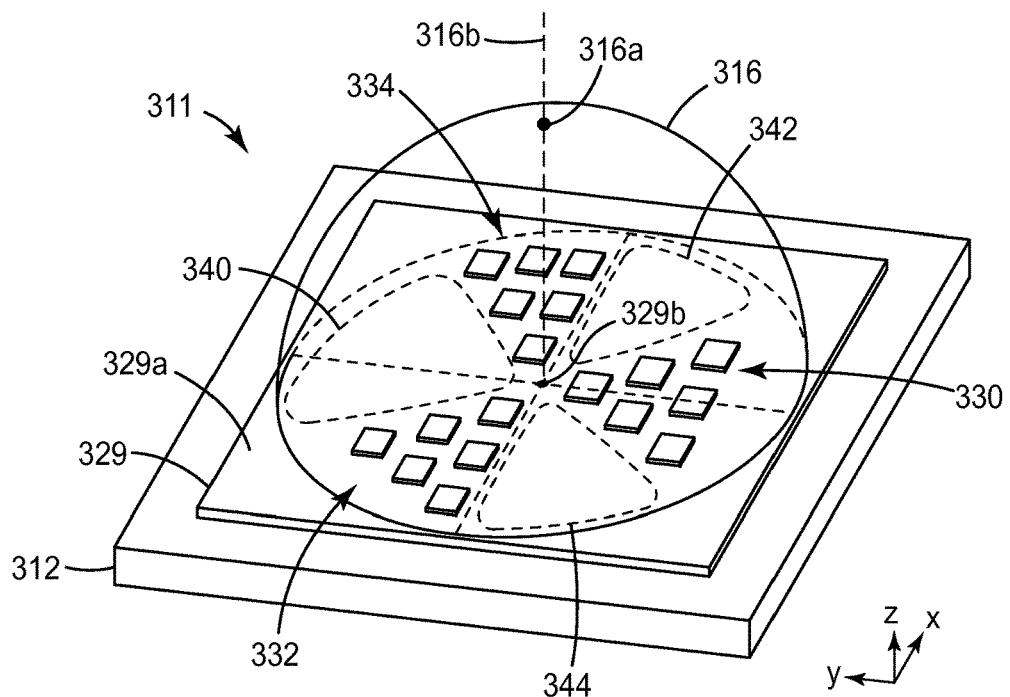
FIG. 3 is a schematic perspective view of a remote phosphor LED.

FIG. 3 is a schematic perspective view of a remote phosphor LED 311, further details of which can be found in the above-cited PCT Publ. No. WO 2012/091973. The remote phosphor LED 311 is referred to here as subsystem 311, and is shown in the context of a Cartesian x-y-z coordinate system. The subsystem 311 includes a substrate 312, which carries a phosphor layer 329 having an outer surface 329a and a reference point 329b. Eighteen LEDs are disposed atop or otherwise proximate the phosphor layer, the LEDs being arranged in three wedge-shaped groups 330, 332, 334 of six neighboring LEDs, each group of neighboring LEDs disposed in a wedge-shaped region of the substrate. The layout of the three wedge-shaped groups of LEDs, and the depicted number and orientation of LEDs in each group, is one of many possible arrangements, and should not be construed in a limiting way. For example, shapes other than wedge-like shapes are also contemplated. The LEDs are preferably encapsulated in a clear polymer or glass, or other suitable light-transmissive material, and an outer surface of the encapsulant may be concave and curved such that a dichroic reflector 316 can be applied and can shapingly conform to such surface. The dichroic reflector may be the same as or similar to the other dichroic reflectors described herein. The shape of the dichroic reflector 316 may define an apex 316a and a symmetry axis or optical axis 316b. The optical axis 316b may coincide with an optical axis of the subsystem 311, and may pass through the reference point 329b and the apex 316a.

The groups of neighboring LEDs are separated from each other by unobstructed wedge-shaped portions 340, 342, 344 of the phosphor layer 329. "Unobstructed" in this regard refers to a portion of the phosphor layer 329 in which substantially no LEDs are present. Further, each group of neighboring LEDs resides in a wedge-shaped region of the substrate that is generally opposite one of the unobstructed wedge-shaped portions of the phosphor layer, from the perspective of the point 329b. Each pair of a wedge-shaped region of the substrate (e.g., the region in which wedge-shaped group 330 of LEDs resides) and its corresponding wedge-shaped portion of the phosphor layer (e.g., the portion 340) may also be generally symmetrical with respect to the point 329b. By configuring the dichroic reflector 316 such that the optical axis 316b passes through the point 329b, and by selecting a suitable radius of curvature of the dichroic reflector, the portion of LED light from each wedge-shaped group of neighboring LEDs that is reflected by the dichroic reflector can be imaged (at least approximately) onto its corresponding wedge-shaped portion of the phosphor layer.

The neighboring LEDs in each of the three LED groups are also shown to be arranged at different radial distances (measured parallel to the x-y plane) from the point 329b and/or from the optical axis 316b. In the depicted arrangement, for example, one LED in each group is disposed closest to the axis 316b, three LEDs in each group are disposed farthest from the axis 316b, and two LEDs in each group are disposed at an intermediate distance from the axis 316b.

In one embodiment of the subsystem 311, all eighteen LEDs may emit LED light according to a same LED emission spectrum, and the phosphor layer 329 may be of uniform composition and structure such that the composition and structure of the phosphor layer is the same throughout and amongst the wedge-shaped portions 340, 342, 344; yet the properties of the dichroic reflector can be tailored to provide different broadband light portions (associated with different LEDs) that have different colors. In particular, a color of a first broadband light portion associated with the subgroup of the one "near" LED (in each group of neighboring LEDs), can differ from a color of a second broadband light portion associated with the subgroup of the two "intermediate" LEDs (in each group of neighboring LEDs), which in turn may differ from a color of a third broadband light portion associated with the subgroup of the three "far" LEDs (in each group of neighboring LEDs). This may be accomplished by ensuring that the spectral band edge or transition region of the average transmission or reflection spectra of the dichroic reflector overlaps with the spectral emission of at least the subgroup of two "intermediate" LEDs and the subgroup of three "far" LEDs, at least at some incidence angles, such that the dichroic reflector transmits a greater fraction of LED light from the subgroup of two intermediate LEDs compared to the subgroup of one near LED, the dichroic reflector also transmitting a greater fraction of LED light from the subgroup of three far LEDs compared to the subgroup of two intermediate LEDs. The relative increase in transmitted short wavelength LED light with increasing radial distance from the optical axis 316b can provide the different colors of the different broadband light portions. And the color of the overall broadband light emission from the source 310 may be controlled or adjusted by controlling the relative degree to which the subgroup of one near LED, the subgroup of two intermediate LEDs, and the subgroup of three far LEDs are energized.

In another embodiment of the subsystem 311, different colors can be achieved for different broadband light portions by using different compositions and/or structures for portions of the phosphor layer associated with different LEDs. For example, the wedge-shaped portion 340 of the phosphor layer 329, which is excited by the six LEDs of LED group 330, may have a different composition and/or structure than that of portions 342 and/or 344. The color of the overall broadband light emission from the subsystem may then be controlled or adjusted by controlling or adjusting the relative degree to which one group of neighboring LEDs (e.g. LED group 330) is energized compared to the other groups of neighboring LEDs (e.g. LED groups 332, 334). Additionally or in the alternative, one, some, or all of the wedge-shaped portions 340, 342, 344, may have a composition and/or structure that is different at different radial distances from the optical axis 316b or reference point 329b. Because of the imaging properties of the curved dichroic reflector 316, the subgroup of one near LED in each group of neighboring LEDs tends to preferentially excite the portion of the wedge-shaped phosphor portion nearest the reference point 329b, and the subgroup of two intermediate LEDs in each group of neighboring LEDs tends to preferentially excite a middle portion of the wedge-shaped phosphor portion, and the subgroup of three far LEDs in each group of neighboring LEDs tends to preferentially excite the portion of the wedge-shaped phosphor portion farthest the reference point 329b. A radially-varying phosphor layer can therefore be used to control or adjust the color of the overall broadband light emission from the source 310 by adjusting or controlling the relative degree to which the subgroup of one near LED, the subgroup of two intermediate LEDs, and the subgroup of three far LEDs are energized. Additionally or in the alternative, one, some, or all of the wedge-shaped portions 340, 342, 344, may comprise a patterned phosphor that includes two or more phosphors of differing emission bands, such as is described above.

In another embodiment of the subsystem 311, different colors can be achieved for different broadband light portions by selecting individual LEDs that have different emission spectra, and then controlling or adjusting the relative degree to which LEDs of different emission properties are energized.

Figure 4:
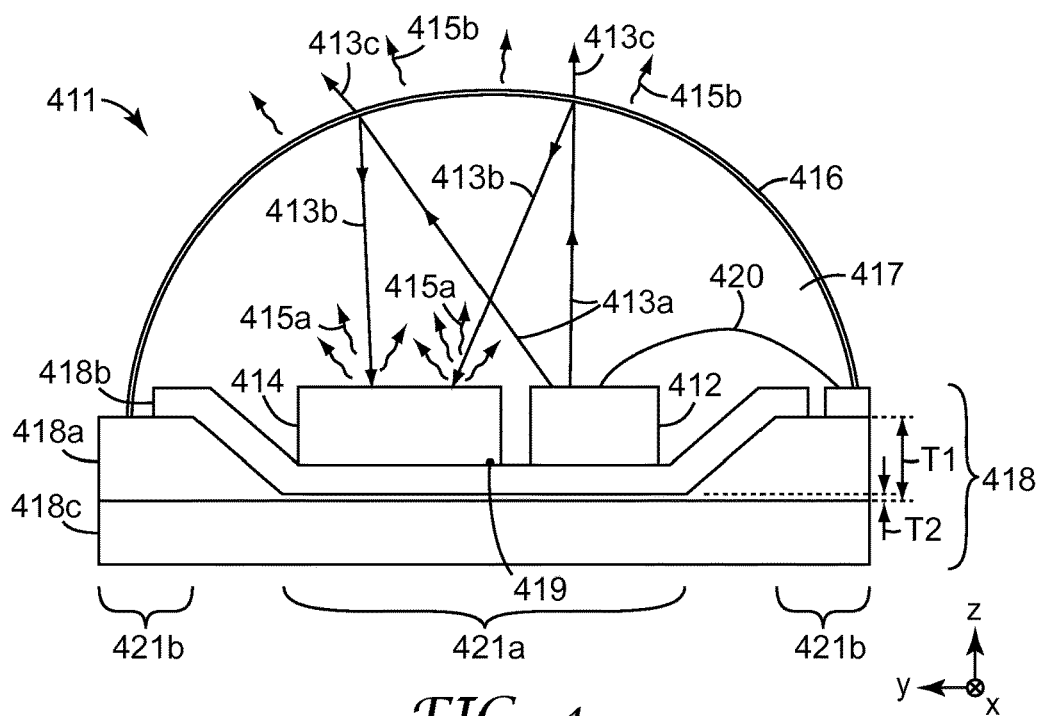
FIG. 4 is a schematic perspective view of another remote phosphor LED.

FIG. 4 is a schematic perspective view of a remote phosphor LED 411, further details of which can be found in the above-cited PCT Publ. No. WO 2012/091973. The remote phosphor LED 411 is referred to here as subsystem 411, and is shown in the context of a Cartesian x-y-z coordinate system. The subsystem 411 includes a blue-light emitting LED 412 disposed on a substrate 418, the substrate also having thereon a phosphor layer 414 that emits longer wavelength visible light when exposed to the blue light from the LED. The LED 412 may connect to a conductive trace by a wire bond 420.

The subsystem 411 also includes a dichroic reflector 416 having a convex shape that opens toward and encompasses the LED and the phosphor layer 414. The center of curvature for the reflector 416 is marked by a point 419. The LED 412 is positioned relatively close to the point 419, and so is the phosphor layer 414. The phosphor layer 414 is shown slightly oversized relative to the LED.

Blue light 413a emitted by the LED 412 is partially reflected by the dichroic reflector 416 to produce reflected LED light 413b, and partially transmitted to produce transmitted LED light 413c. The reflected LED light 413b is directed onto the phosphor layer 414, which excites the phosphor and causes the phosphor layer to emit longer wavelength light 415a. This longer wavelength light is highly transmitted by the dichroic reflector 416 to produce phosphor light 415b. The transmitted light 413c and transmitted light 415b combine spatially to provide broadband output light, such as white light, for the subsystem source 411. The interior space 417 may comprise a suitable light-transmissive glass or polymer material that encapsulates the LED and the phosphor, and the dichroic reflector may be applied to the outer surface of such an encapsulant. Alternatively, the interior space 417 may be unfilled.

In subsystem 411, the substrate 418 is preferably thin for flexibility, greater heat conduction (and lower thermal resistance) to an underlying heat sink (not shown), and for space savings. Although generally thin, the substrate 418 is desirably molded, etched, or otherwise shaped to be even thinner in a cavity region 421a compared to an adjacent or neighboring region 421b, these regions being shown as separated by a beveled transition region. The reduced thickness, which provides an even greater heat conduction in the cavity region relative to the neighboring region, is desirably associated with the reduced thickness of a dielectric layer 418a which forms part of the substrate. In the figure, the dielectric layer 418a is shown to have a thickness T1 in the neighboring regions 421b, and a smaller thickness T2 in the cavity region 421a. Disposed atop the dielectric layer 418a is an electrically conductive layer 418b, which may be patterned as desired to provide power to the LED. A thermally conductive layer 418c is disposed on an opposite major surface of the dielectric layer compared to layer 418b. In some cases, the layers 418b, 418c may be composed of the same material, e.g., copper, while in other cases different materials may be used. Thus, the electrically conductive layer 418b may also be thermally conductive, and the thermally conductive layer 418c may also be electrically conductive. The thermally conductive layer 418c is preferably bonded to a suitable heat sink, e.g., using a suitable thermal interface material.

The thinned region of substrate 418 is preferably associated with a corresponding thinned region of the dielectric layer 418a, which is in many cases a key structural component of the substrate. Suitable dielectric layers include polyesters, polycarbonates, liquid crystal polymers, and polyimides. Suitable polyimides include those available under the trade names KAPTON, available from DuPont; APICAL, available from Kaneka Tex. corporation; SKC Kolon PI, available from SKC Kolon PI Inc.; and UPILEX and UPISEL, available from Ube Industries. Polyimides available under the trade designations UPILEX S, UPILEX SN, and UPISEL VT, all available from Ube Industries, Japan, are particularly advantageous in many applications. These polyimides are made from monomers such as biphenyl tetracarboxylic dianhydride (BPDA) and phenyl diamine (PDA). The dielectric layer 418a may be thinned in the cavity region using any suitable method such as chemical etching, plasma etching, focused ion-beam etching, laser ablation, and punching. With regard to etching, any suitable etchant may be used, and the preferred etchant may depend on the material(s) used in the dielectric layer. Suitable etchants may include alkali metal salts, e.g. potassium hydroxide; alkali metal salts with one or both of solubilizers, e.g., amines, and alcohols, such as ethylene glycol. Suitable chemical etchants may include KOH/ethanol amine/ethylene glycol etchants such as those described in more detail in U.S. Patent Publication US 2007/0120089 (Mao et al), incorporated herein by reference. Other suitable chemical etchants may include KOH/glycine etchants such as those described in more detail in commonly assigned PCT Patent Publication WO 2012/061010, incorporated herein by reference. After etching, the dielectric layer may be treated with an alkaline KOH/potassium permanganate (PPM) solution, e.g., a solution of about 0.7 to about 1.0 wt % KOH and about 3 wt % KMnO4. The dielectric layers may be clad on one or both sides with a conductive layer, e.g., layers 418b and 418c of FIG. 4. The conductive layers may be composed of any suitable electrically and/or thermally conductive materials, but typically comprise copper. If the conductive layer(s) are to be formed into circuits, they may be pre-patterned if desired. In some cases, the flexible substrate may have a multilayer construction, including multiple layers of dielectric material and conductive material in a stacked arrangement.

The type of thinning procedure used can affect the transition between the cavity region and the neighboring region, as well as the characteristics of the side walls of the dielectric layer and other layers in the transition region. Chemical etching can be used to produce relatively shallow side walls, e.g., typical side wall angles in a range from about 5 to 60 degrees measured from the plane of the flexible substrate, or from about 25 to 28 degrees. Other techniques, such as punching, plasma etching, focused ion-beam etching, and laser ablation, may produce much steeper side walls, e.g. wall angles up to about 90 degrees. In some cases, such as with punching, a hole may be formed completely through the dielectric layer, which is discussed further below. In such cases, other layers of the flexible substrate, such as conductive layers 418b and/or 418c, may be utilized to provide physical support for the LED(s) and/or phosphor layer in the cavity region.

In exemplary embodiments, the dielectric layer is significantly thinner in the cavity region 421a compared to the neighboring region 421b to increase heat conduction away from the LED(s) and/or phosphor layer and to maintain these components at cooler operating temperatures. For example, the thickness T2 may be about 5 to 25% of T1. Furthermore, T2 may be greater than zero but no more than 10 microns, while T1 may be at least 20 microns. In exemplary embodiments, T1 may be no more than 200 microns. In addition to increasing heat conduction, the thinned nature of the cavity region can provide other advantages such as the formation of slanted side walls, which may be coated with a reflecting material to provide enhanced efficiency. Also, by attaching LED(s) and/or a phosphor layer to the substrate in the thinned cavity region, these components do not extend as high above the plane of the flexible substrate, producing a lower profile device that is better suited for low form factor applications.

The reader is reminded that the remote phosphor LEDs of FIGS. 3 and 4, and those described elsewhere herein, are exemplary, and that remote phosphor LEDs of other designs and characteristics may also be used in the disclosed broadband light sources.

Figure 5:
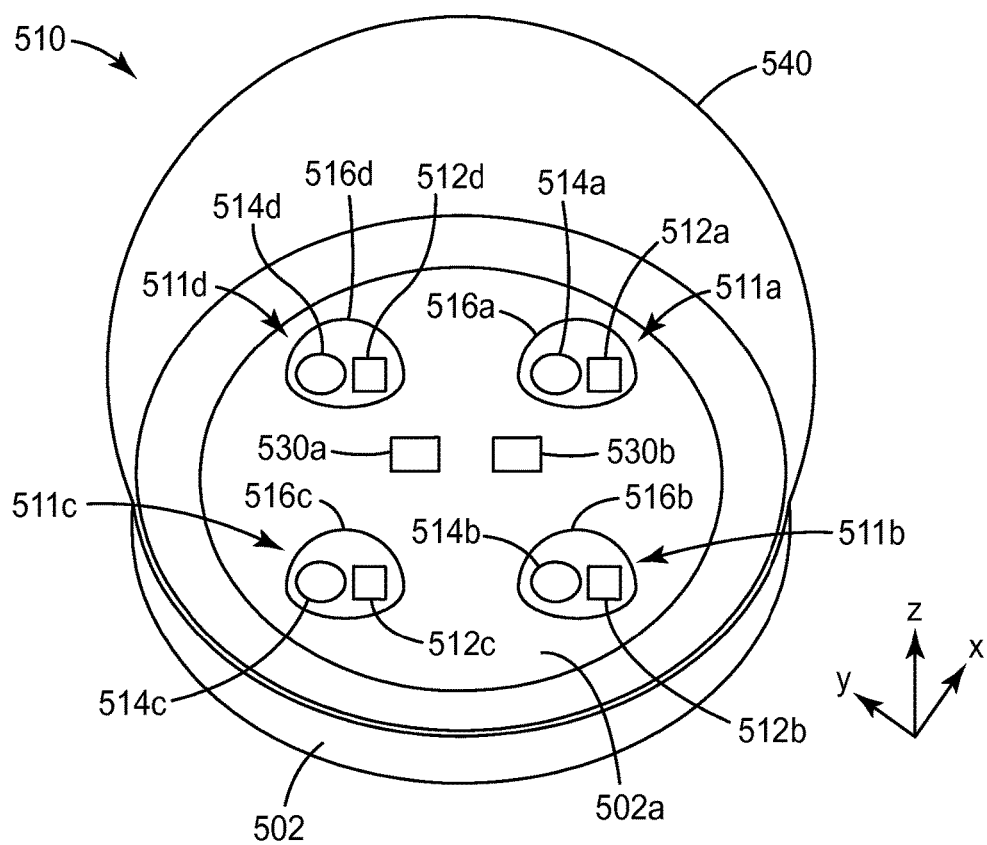
FIG. 5 is a schematic perspective view of broadband light source that combines several remote phosphor LEDs and several direct emitting LEDs.

One such broadband light source 510 is shown schematically in FIG. 5. This light source 510 combines several remote phosphor LEDs 511a, 511b, 511c, 511d, and several direct emitting LEDs 530a, 530b. Some or all of these components may be attached directly or indirectly, through one or more intermediate layers or elements, to a supporting base 502. A light-transmissive bulb or other cover member 540 may attach to the base 502, directly or indirectly, to seal or otherwise enclose the remote phosphor LEDs and the direct emitting LEDs.

Each of the remote phosphor LEDs 511a, 511b, 511c, 511d may be the same as or similar to the remote phosphor LED 111 of FIG. 1, or to other remote phosphor LEDs disclosed herein. For simplicity, each remote phosphor LED of FIG. 5 is shown as having exactly one pump LED (see elements 512a, 512b, 512c, 512d), and exactly one phosphor layer (see elements 514a, 514b, 514c, 514d), as well as a concave dichroic reflector (see elements 516a, 516b, 516c, 516d). However, more pump LEDs, and/or more and/or differently configured phosphor layers, can also be used in one, some, or all of the remote phosphor LEDs shown in FIG. 5. Four remote phosphor LEDs are shown in the figure, but other numbers of remote phosphor LEDs may be used, including only 1, or 2, or 3, or more than 4. When more than one remote phosphor LED is used, they may be designed to be the same as or similar to each other, or they may have different designs, for example, different numbers of pump LEDs, and/or different LED types (e.g. colors or wavelengths), and/or different numbers of phosphor layers, and/or different phosphor layer thicknesses, and/or different phosphor types, and/or different dichroic reflectors, such that they individually provide different output light. The remote phosphor LEDs may be arranged symmetrically with respect to a central point or optical axis of the light source 510, or they may be arranged asymmetrically and/or irregularly.

Each of the direct emitting LEDs 530a, 530b may be the same as or similar to the direct emitting phosphor LED 130 of FIG. 1, or to other direct emitting LEDs disclosed herein. Two direct emitting LEDs are shown in the figure, but other numbers of direct emitting LEDs may be used, including only 1, or 3, or 4, or more than 4. When more than one direct emitting LED is used, they may be designed to be the same as or similar to each other, or they may have different designs, for example, different spectral distributions (including different spectral widths, e.g. as measured by the full width at half maximum (FWHM)), and/or different peak wavelengths or colors, and/or different output powers, such that they individually provide different output light. The direct emitting LEDs may be arranged symmetrically with respect to a central point or optical axis of the light source 510, or they may be arranged asymmetrically and/or irregularly.

The cover member 540 may be the same as or similar to the cover member 140 of FIG. 1, or to other cover members disclosed herein.

The base 502 may be the same as or similar to other bases disclosed herein. For example, the base 502 may be compatible with conventional light fixtures, and may have electrical contacts as needed and suitable circuitry to convert input electrical power to voltages and currents that are compatible with LEDs. Preferably, the base 502 includes a reflective surface 502a on which the direct emitting LEDs and the remote phosphor LEDs are mounted. Suitable reflectors include layers or coatings of aluminum, silver, or other suitable metals, and/or dielectric materials to enhance reflectivity such as multilayer organic or inorganic thin film stacks, and/or pigmented layers such as a titanium dioxide-filled resin layer. The base 502 also preferably has good thermal conductivity and heat sink properties so that the various LEDs and phosphor layers do not become excessively hot during operation of the light source 510. Excessive heat can reduce the efficiencies and lifetimes of such components. The source 510 may also include, or couple to, a control system (see FIG. 1) that energizes the various LEDs in the source 510.

In the source 510, light from the various remote phosphor LEDs, and light from the various direct emitting LEDs, is transmitted by the cover member 540 and combined to provide a broadband output light for the source, as discussed for example in connection with FIG. 1. In one exemplary embodiment, the LED 530a may emit red light, e.g., having a peak wavelength in a range from 600 to 650 nm, and the LED 530b may emit blue light, e.g. having a peak wavelength in a range from 445 to 500 nm, and each of the four remote phosphor LEDs may use a blue or UV pump LED and emit yellow phosphor light, and the output light of the light source 510 may be substantially white. In other embodiments, multiple direct emitting LEDs of nominally the same color (e.g. blue or red) but with different peak wavelengths may be used to increase the color rendering index (CRI) and/or color quality scale (CQS) of the broadband light output of the source, as well as the luminous efficacy. For example, two direct emitting LEDs that each emit blue light but have differing peak wavelengths, and/or two direct emitting LEDs that each emit red light but have differing peak wavelengths, may be used. The difference in peak wavelength may be, for example, at least 5 or 10 nm, but less than 50 or 40 nm. For example, one direct emitting blue LED may have a peak wavelength of 445 nm, and another direct emitting blue LED may have a peak wavelength of 480 nm.

Figure 6:
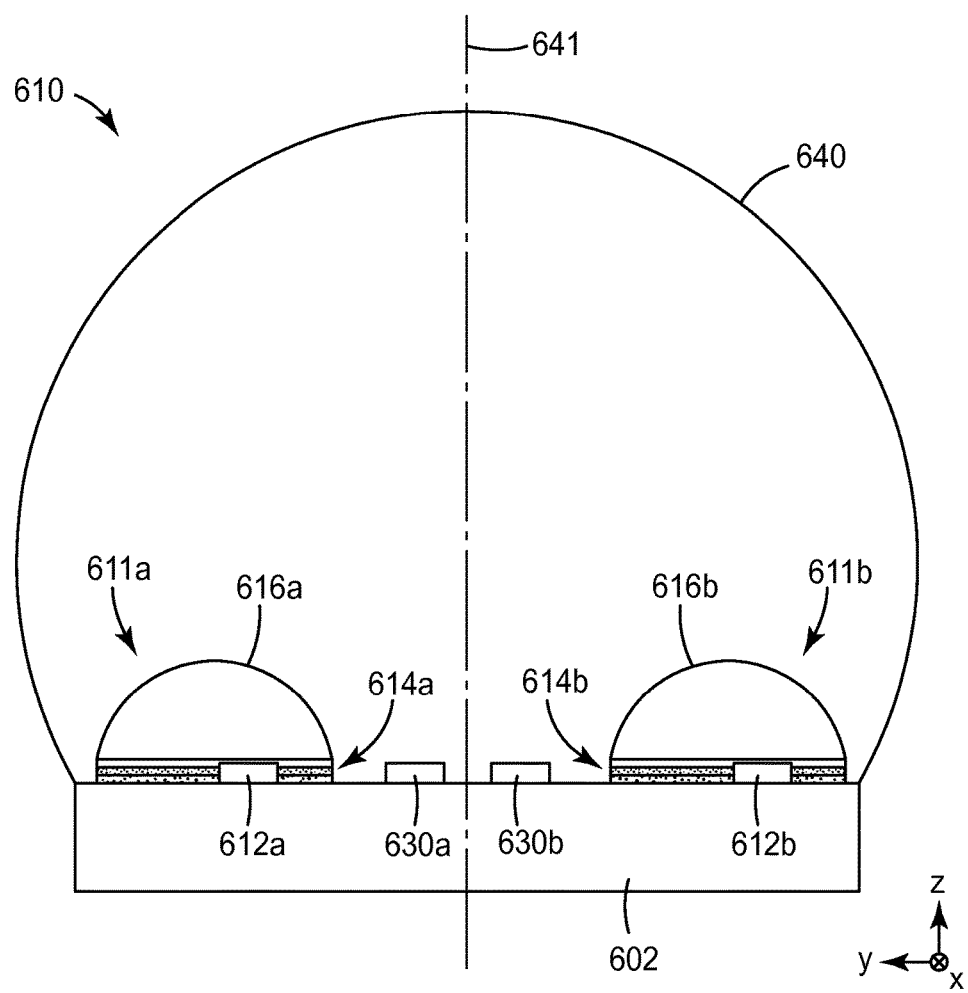
FIG. 6 is a schematic side- or cross-sectional view of another broadband light source that combines several remote phosphor LEDs and several direct emitting LEDs.

Another broadband light source 610 is shown schematically, in side- or cross-sectional view, in FIG. 6. This light source 610 combines several remote phosphor LEDs 611a, 611b, and several direct emitting LEDs 630a, 630b. Some or all of these components may be attached directly or indirectly, through one or more intermediate layers or elements, to a supporting base 602. A light-transmissive bulb or other cover member 640 may attach to the base 602, directly or indirectly, to seal or otherwise enclose the remote phosphor LEDs and the direct emitting LEDs. The source 610 is shown as having an axis of symmetry or optical axis 604.

Figure 6A:
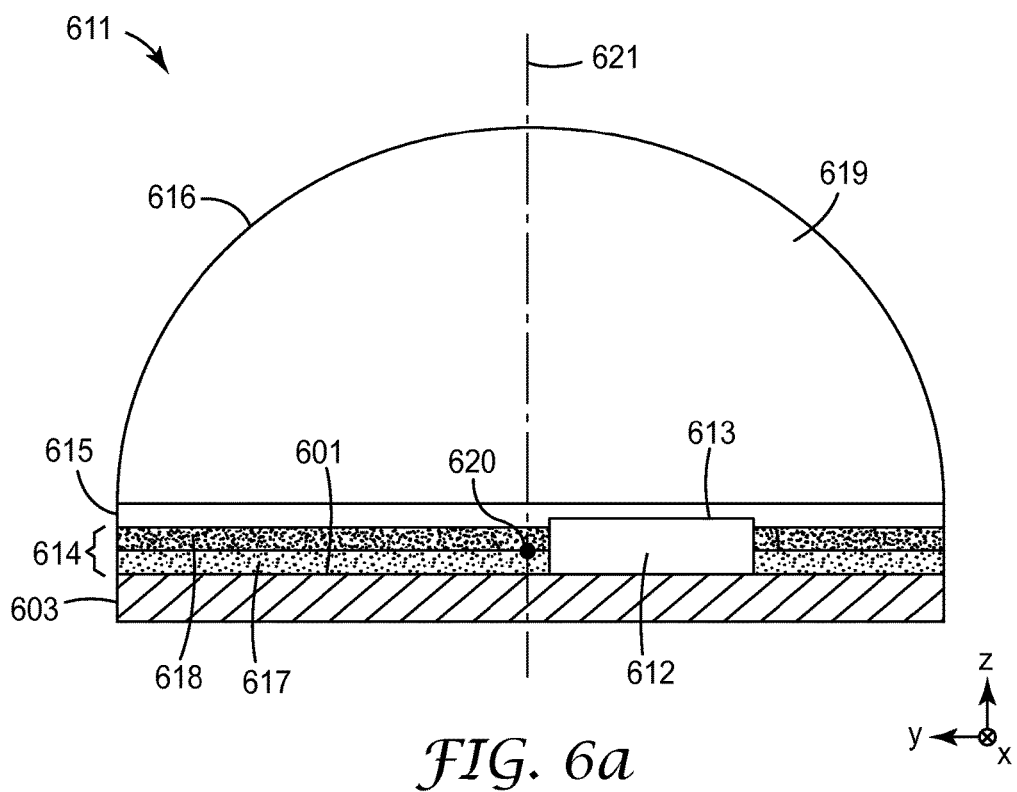
FIG. 6a is a schematic side- or cross-sectional view of a remote phosphor LED used in the light source of FIG. 6.

The remote phosphor LEDs 611a, 611b may be similar to the remote phosphor LEDs of FIG. 5, except for the phosphor layer arrangement, which is shown in greater detail in FIG. 6a. Each remote phosphor LED of FIG. 6 is shown as having exactly one pump LED (see elements 612a, 612b), and a particular phosphor layer arrangement (see elements 614a, 614b), as well as a concave dichroic reflector (see elements 616a, 616b). However, more pump LEDs, and/or more and/or differently configured phosphor layers, can also be used in one or both of the remote phosphor LEDs shown in FIG. 6. Two remote phosphor LEDs are shown in the side view of FIG. 6, but the source 610 may have 4 total remote phosphor LEDs as arranged for example in FIG. 5, or the source 610 may be modified to have other numbers of remote phosphor LEDs, such as only 1, or 3, or 5, or more. The remote phosphor LEDs 611a, 611b are shown in the side view of FIG. 6 as being positioned symmetrically with respect to a symmetry axis or optical axis 641 of the source 610. In other embodiments, the remote phosphor LEDs need not be symmetrically positioned. When more than one remote phosphor LED is used, they may be the same as or different from each other, as discussed above.

The direct emitting LEDs 630a, 630b may be the same as or similar to the direct emitting phosphor LEDs 530a, 530b of FIG. 5. Two direct emitting LEDs are shown in the figure, but other numbers of direct emitting LEDs may be used, including only 1, or 3, or 4, or more than 4. When more than one direct emitting LED is used, they may be the same or different as discussed above. In the side view of FIG. 6, the LEDs 630a, 630b are shown as being positioned symmetrically with respect to the optical axis 641. In other embodiments, the direct emitting LEDs need not be symmetrically positioned.

The cover member 640 may be the same as or similar to the cover member 540 of FIG. 5, and the base 602 may be the same as or similar to the base 502 of FIG. 5.

In the source 610, light from the remote phosphor LEDs 611a, 611b, and light from the direct emitting LEDs 630a, 630b, is transmitted by the cover member 640 and combined to provide a broadband output light for the source, as discussed for example in connection with FIG. 5. In one exemplary embodiment, the LED 630a may emit red light, e.g., having a peak wavelength in a range from 600 to 650 nm, and the LED 630b may emit blue light, e.g. having a peak wavelength in a range from 445 to 500 nm, and each of the two remote phosphor LEDs may use a blue or UV pump LED and emit yellow phosphor light, and the output light of the light source 610 may be substantially white.

FIG. 6a is a schematic side- or cross-sectional view of a remote phosphor LED 611 that may be the same as one or both of the remote phosphor LEDs 611a, 611b shown in FIG. 6. In FIG. 6a, the remote phosphor LED 611 has a pump LED 612, a phosphor layer 614, and a dichroic reflector 616. The dichroic reflector 616 covers the entire outer curved surface of a plano-convex lens or body 619, but in other embodiments the dichroic reflector may be made to cover only a portion of the outer curved surface. The reflector 616 is concave with respect to the LED 612 and phosphor layer 614. The dichroic reflector 616 also covers both the LED 612 and the phosphor layer 614. The body 619 has an axis of symmetry which defines an optical axis 621 of the remote phosphor LED 611. The outer curved surface of the body 619 is a section of a sphere whose center of curvature is disposed at a point 620. The pump LED 612 is situated near but spaced apart from the point 620 along the y-direction. Situated in this manner, and due to the concave shape of the reflector 616, the reflector 616 approximately images excitation light from the LED 612 onto a portion of the phosphor layer 614 on the opposite side of point 620, i.e., to the left of point 620 from the perspective of FIG. 6a.

The phosphor layer 614 is divided into two thinner phosphor layers 617, 618, which may be composed of different phosphor materials. In general, the phosphor layer may have a wide variety of configurations, and may comprise the same or different phosphor materials in distinct layers, zones, or patterned areas. In an exemplary embodiment, the upper phosphor layer 618 emits red phosphor light, and the lower phosphor layer 617 emits green phosphor light. A clear light-transmissive layer 615, which may for example be a layer of optical adhesive, separates the phosphor layer 614 (more specifically, the upper phosphor layer 618) from the planar surface of the body 619. An upper emitting major surface 613 of the pump LED 612 may be disposed within the layer 615 as shown.

The base 603 may be the same as base 602 in FIG. 6, or the base 603 may be a different support substrate used in the fabrication of the remote phosphor LED 611, which base 603 is then adhered, bonded, or otherwise attached to the base 602 of FIG. 6. The base 603 preferably has good thermal conductivity to extract heat from the LED 612 and from the phosphor layer 614. The base 603 may include electrical contacts or traces (not shown) connected to the pump LED to allow electrical control thereof. The base 603 also preferably has a reflective surface 601 that faces the phosphor layer 614 and the pump LED 612, so that excitation light and phosphor light that reach the back of the remote phosphor LED and that would be absorbed or otherwise lost can be redirected towards the front of the remote phosphor LED to boost the efficiency and light output of the remote phosphor LED 611.

EXAMPLES

Some of the hybrid broadband light sources disclosed herein were modeled or simulated, and their output characteristics were evaluated. The simulations used LightTools™ optical design software. Each of the examples used four remote phosphor LEDs and two direct emitting LEDs arranged on a base, and with a bulb or cover member, as shown generally in FIGS. 5 and 6, but where the remote phosphor LEDs were of the construction shown in FIGS. 6 and 6a.

The simulations used an optimization routine, which was implemented for each example as follows: a merit function was set up by assigning target values and relative weights to some specific output parameters, and several design parameters were treated for purposes of the optimization as independent variables, and were assigned upper and lower bounds. The software then calculated optimized values for each of the independent variable design parameters (within their respective upper and lower bounds) that maximized the merit function defined by the specific output parameters.

The output parameter of greatest interest was the color, measured in terms of the CIE x and y color coordinates, of the broadband output light emitted by the light source. For purposes of these CIE x and y color coordinates, the output light of the light source was spatially averaged in a square detection plane that was 20 mm×20 mm in size and tangent to, and centered at, the apex of the concave cover member (cover member 540 in FIG. 5, cover member 640 in FIG. 6). Other output parameters of interest, which were assigned relative weights orders of magnitude smaller than the output color so that they did not substantially affect the optimization, were: the radiometric output of the light source, measured in watts; the photometric output of the light source, measured in lumens; the color rendering index (CRI) of the light source output; the general color quality scale (CQS) of the light source output, where CQS refers to the known scale developed by the U.S. National Institute of Standards and Technology (NIST) as an alternative to the CRI as a measure of lighting quality of white light sources; and the correlated color temperature (CCT) of the light source output. All of these output parameters were evaluated with regard to all light from the broadband light source that was detected at the specified detection plane.

Six independent variable design parameters were used in each simulation: the radiometric power output of each of the two direct emitting LEDs, which was bounded between 0 and 3 watts each; the peak radiant wavelength $\lambda$ of each direct emitting LED, which was bounded between 450 and 480 nm for one (blue-emitting) LED, and between 550 and 620 nm for the other (red-emitting) LED; and the phosphor particle density for the two phosphor layers (see layers 617, 618 in FIG. 6a), which were each bounded between 0.0001 and 100,000,000 particles per $mm^3$.

Figure 7:
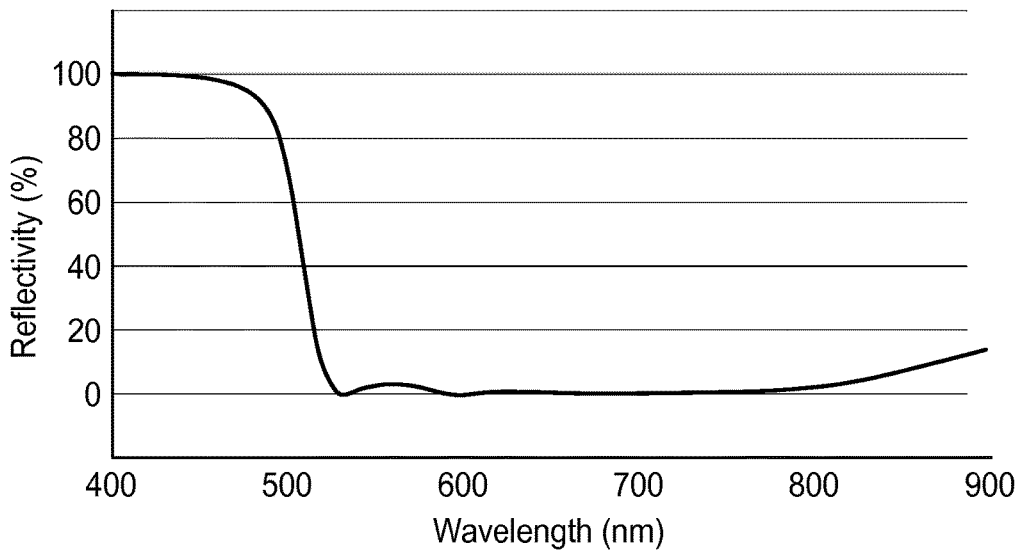
FIG. 7 is a graph of spectral reflectivity for a dichroic reflector.
Figure 8:
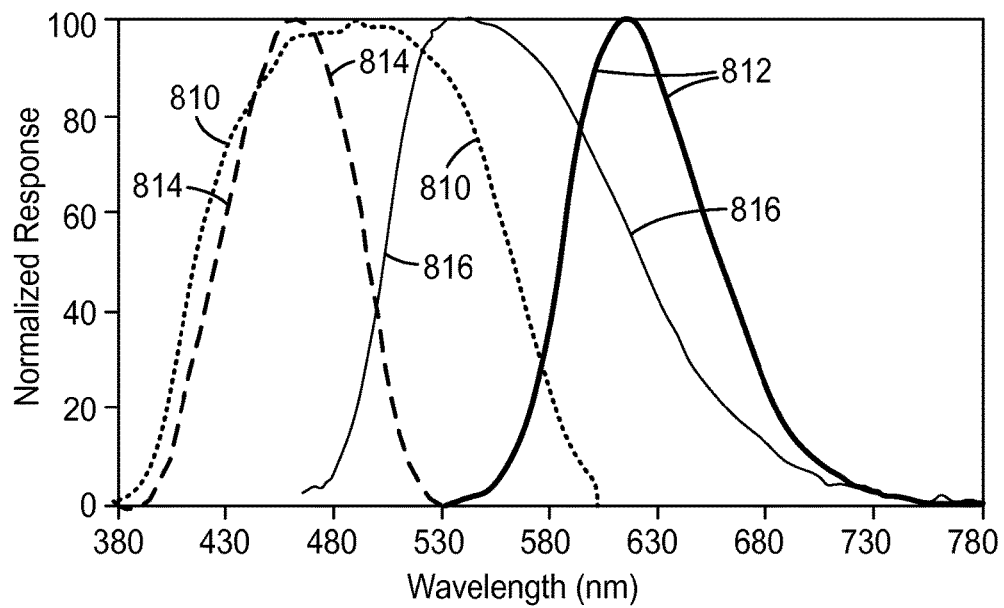
FIG. 8 is a graph of spectral properties of two phosphor materials for use in a remote phosphor LED.

Additional design features for the simulated embodiments included the following:
  the two direct emitting LEDs (see 530a, 530b in FIG. 5, and 630a, 630b in FIG. 6) each had a square 1×1 mm emitting area, and were positioned symmetrically with respect to the center of the source (axis 641 in FIG. 6), the centers of each LED being 0.75 mm from the center of the source. These LEDs had a thickness of 10 microns, and a reflective coating on their back surfaces, the reflective coating having a 50% reflectivity and 50% absorption.
  the cover member was modeled as a diffusive bulb that scattered light in the forward direction with a Lambertian distribution. The cover member was hemispherical in shape, with a radius of curvature of about 10 mm and a thickness of 0.1 mm. The space within the cover member, i.e., between the cover member and the remote phosphor LEDs, was assumed to be air.
  the four remote phosphor LEDs in each simulated embodiment were assumed to be identical in construction, and they were positioned symmetrically 3.5 mm from the center of the source (axis 641 in FIG. 6). Each remote phosphor LED was substantially as shown in FIG. 6a, wherein:
    the plano-convex body 619 had a radius of curvature of 2 mm and a thickness of 1.8 mm, was assumed to be made of BK7 glass;

the dichroic reflector 616 covered the entire outer curved surface of the body 619, and was a 13 layer stack of alternating SiO2/Tio2 microlayers, the stack providing a spectral reflectivity for normally incident light as shown in FIG. 7;

the layer 615 was 0.1 mm thick and had a refractive index of 1.41; the emitting surface 613 of the pump LED 612 was in the center (with regard to the z-axis) of this layer;

the pump LED 612 had a square 1×1 mm emitting area for the emitting surface 613, and a thickness of 10 microns and a back reflector like the other LEDs. The LED 612 was positioned such that a gap of 0.05 was formed (along the y-axis in FIG. 6a) between the center of curvature point 620 and the edge of the LED 612. The LED 612 had a radiant output power of 1 watt. In some of the examples, the LED 612 in the four remote phosphor LEDs had a peak wavelength of 445 nm and a spectral width (FWHM) of 19 nm, while in another example, the LEDs 612 had a peak wavelength of 415 nm and a spectral width (FWHM) of 19 nm.

the phosphor layers 617, 618 were each 0.1 mm thick. The upper layer 618 was assumed to emit red phosphor light, and had a normalized absorption spectrum defined by curve 810 in FIG. 8 and a normalized emission spectrum defined by curve 812 in FIG. 8. The lower layer 617 was assumed to emit green phosphor light, and had a normalized absorption spectrum defined by curve 814 in FIG. 8 and a normalized emission spectrum defined by curve 816 in FIG. 8. Each of the layers 617, 618 was assumed to be composed of phosphor particles of refractive index 1.8 immersed in a silicone binder of refractive index 1.41; the quantum efficiency of the green-emitting phosphor layer was 91%, and the quantum efficiency of the red-emitting phosphor layer was 59%; and the back surface of the lower phosphor layer 617 was assumed to be a Lambertian scatterer with 98% reflectivity.

Example 1

In a first example, the pump LEDs 612 had peak wavelengths of 445 nm, and a target output color for the light source (see 510 in FIGS. 5 and 610 in FIG. 6) was set at (0.44, 0.40) for the (x, y) CIE color coordinates, respectively. Target values for the other output parameters, and their respective weights in the merit function, are provided below in Table 1.

Figure 9:
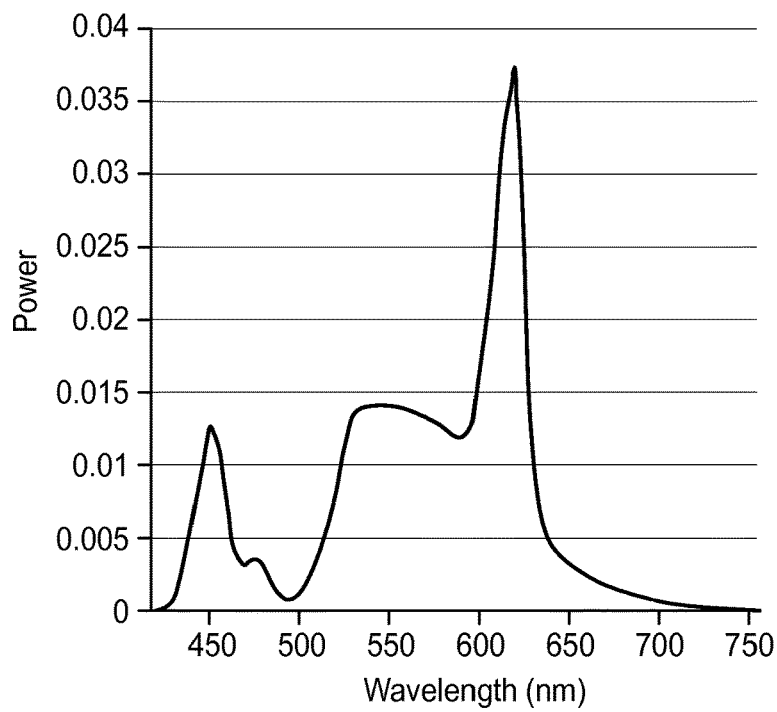
FIGS. 9-12 are graphs of spectral power output for four different simulated broadband light sources.

The optical design software was then run. As part of the simulation, optimized values for the output parameters were calculated. The results of these calculations are included in Table 1. Optimized values for the six independent variable design parameters were also calculated. The results of these calculations are shown in Table 2 below. Note that in this table, the "Red LED" refers to direct emitting LED 530a (FIG. 5) or 630a (FIG. 6), and the "Blue LED" refers to direct emitting LED 530b (FIG. 5) or 630b (FIG. 6). The spectral power output in the specified detector plane was also calculated, assuming the optimized values for all of the respective parameters. This spectral power output for Example 1 is shown in FIG. 9.

TABLE 1

| Output Parameter | Target value | Weight | Optimized value | Difference |
|---|---|---|---|---|
| Total power | 6.0 watts | 0.01 | 1.5671 watts | −4.4329 watts |
| CIE x | 0.44 | 1.0 | 0.44107 | 0.0010661 |
| CIE y | 0.40 | 1.0 | 0.39829 | −0.0017105 |
| General CQS | 100 | 0.001 | 79.035 | −20.965 |
| Lumens | 1,049.4 | 0.00001 | 949.57 | −99.874 |
| General CRI | 73.681 | 0.00001 | 81.056 | 7.3750 |
| CCT | 2,923 | 0.00001 | 3,028.3 | 105.35 |

TABLE 2

| Parameter | Lower Bound | Upper Bound | Optimized value |
|---|---|---|---|
| Green phosphor density | 0.0001 | 100,000,000 | 25,512 |
| Red phosphor density | 0.0001 | 100,000,000 | 480.29 |
| Red LED central λ | 550 nm | 620 nm | 612.34 nm |
| Blue LED central λ | 450 nm | 480 nm | 473.97 nm |
| Red LED power | 0 watts | 3 watts | 0.77657 watts |
| Blue LED power | 0 watts | 3 watts | 0.10287 watts |

Example 2

A second example was then simulated using the optical design software. This Example 2 was the same as Example 1, except that the target output color was changed to (0.35, 0.35) for the (x, y) CIE color coordinates, respectively. Target values for the other output parameters, and their respective weights in the merit function, were the same, as shown below in Table 3.

Figure 10:
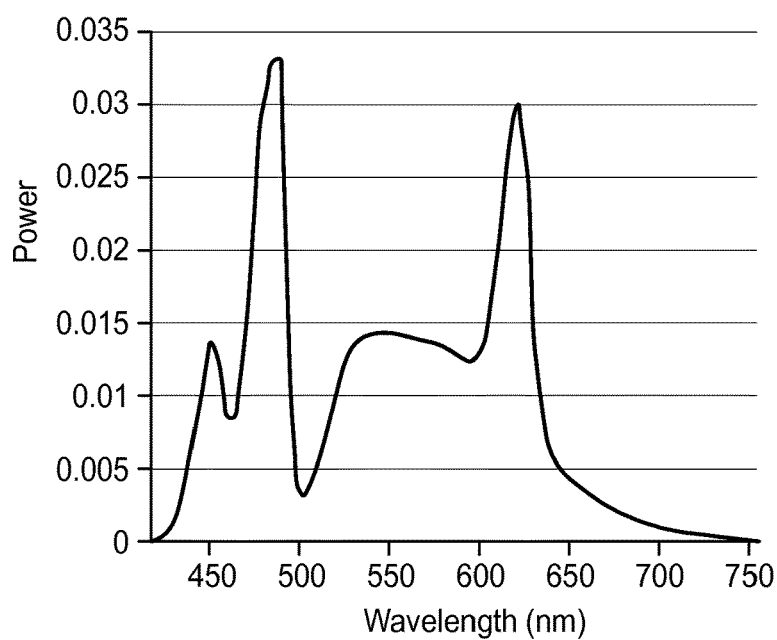

The optical design software again calculated optimized values for the output parameters, which are included in Table 3. Optimized values for the six independent variable design parameters were also calculated, and are shown in Table 4 below. The spectral power output in the specified detector plane was also calculated, assuming the optimized values for all of the respective parameters. This spectral power output for Example 2 is shown in FIG. 10.

TABLE 3

| Parameter | Target value | Weight | Optimized value | Difference |
|---|---|---|---|---|
| Total power | 6.0 watts | 0.01 | 1.9863 watts | −4.0137 watts |
| CIE x | 0.35 | 1.0 | 0.36108 | 0.011085 |
| CIE y | 0.35 | 1.0 | 0.39829 | −0.0042327 |
| General CQS | 100 | 0.001 | 85.940 | −14.060 |
| Lumens | 1,049.4 | 0.00001 | 976.53 | −72.915 |
| General CRI | 73.681 | 0.00001 | 83.711 | 10.031 |
| CCT | 2,923 | 0.00001 | 4,451.3 | 1,528.3 |

TABLE 4

| Parameter | Lower Bound | Upper Bound | Optimized value |
|---|---|---|---|
| Green phosphor density | 0.0001 | 100,000,000 | 6,965.2 |
| Red phosphor density | 0.0001 | 100,000,000 | 1,956.8 |
| Red LED central λ | 550 nm | 620 nm | 617.49 nm |
| Blue LED central λ | 450 nm | 480 nm | 478.37 nm |
| Red LED power | 0 watts | 3 watts | 0.55854 watts |
| Blue LED power | 0 watts | 3 watts | 0.99886 watts |

Example 3

A third example was then simulated using the optical design software. This Example 3 was the same as Examples 1 and 2, except that the target output color was changed to (0.32, 0.28) for the (x, y) CIE color coordinates, respectively. Target values for the other output parameters, and their respective weights in the merit function, were the same, as shown below in Table 5.

Figure 11:
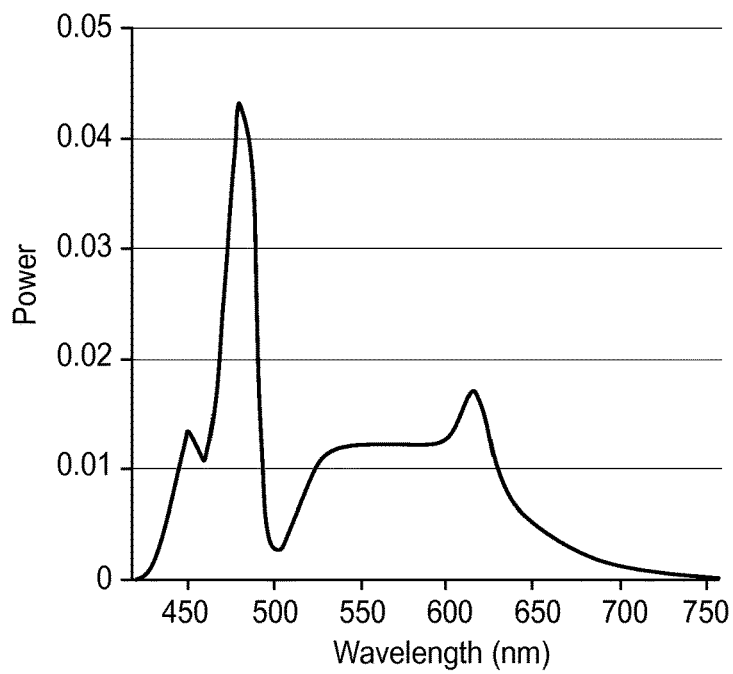

The optical design software again calculated optimized values for the output parameters, which are included in Table 5. Optimized values for the six independent variable design parameters were also calculated, and are shown in Table 6 below. The spectral power output in the specified detector plane was also calculated, assuming the optimized values for all of the respective parameters. This spectral power output for Example 3 is shown in FIG. 11.

TABLE 5

| Parameter | Target value | Weight | Optimized value | Difference |
|---|---|---|---|---|
| Total power | 6.0 watts | 0.01 | 1.9187 watts | −4.0813 watts |
| CIE x | 0.30 | 1.0 | 0.31950 | 0.019497 |
| CIE y | 0.32 | 1.0 | 0.30826 | −0.011740 |
| General CQS | 100 | 0.001 | 79.826 | −20.174 |
| Lumens | 1,049.4 | 0.00001 | 856.41 | −193.04 |
| General CRI | 73.681 | 0.00001 | 76.263 | 2.5822 |
| CCT | 2,923 | 0.00001 | 6,351.3 | 3,428.3 |

TABLE 6

| Parameter | Lower Bound | Upper Bound | Optimized value |
|---|---|---|---|
| Green phosphor density | 0.0001 | 100,000,000 | 5,364.4 |
| Red phosphor density | 0.0001 | 100,000,000 | 5,481.1 |
| Red LED central λ | 550 nm | 620 nm | 614.81 nm |
| Blue LED central λ | 450 nm | 480 nm | 476.12 nm |
| Red LED power | 0 watts | 3 watts | 0.19349 watts |
| Blue LED power | 0 watts | 3 watts | 1.2824 watts |

Example 4

A fourth example was then simulated using the optical design software. This Example 4 was the same as Example 1, except that the pump LEDs 612 had peak wavelengths of 415 nm rather than 445 nm. Due to this change in excitation wavelength, the quantum efficiency of the red and green phosphor materials was reduced, from 91% for Example 1 to 59% for this Example 4. Target values for the output parameters, and their respective weights in the merit function, were the same as those of Example 1 as shown below in Table 7, except that the target radiometric power was reduced from 6 watts to 3 watts.

Figure 12:
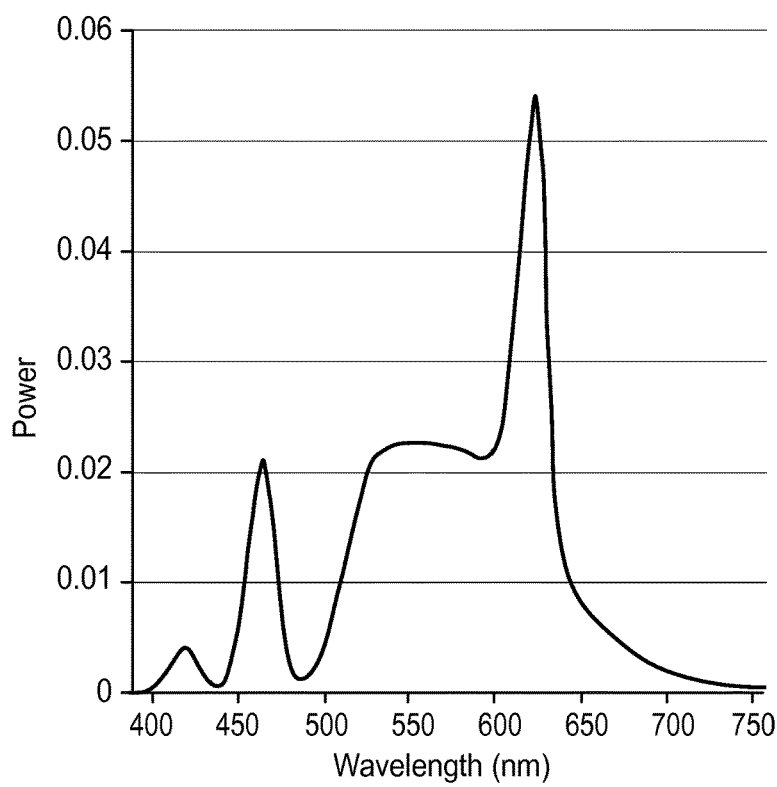

The optical design software again calculated optimized values for the output parameters, which are included in Table 7. Optimized values for the six independent variable design parameters were also calculated, and are shown in Table 8 below. The spectral power output in the specified detector plane was also calculated, assuming the optimized values for all of the respective parameters. This spectral power output for Example 4 is shown in FIG. 12.

TABLE 7

| Parameter | Target value | Weight | Optimized value | Difference |
|---|---|---|---|---|
| Total power | 3.0 watts | 0.01 | 1.9112 watts | −1.0888 watts |
| CIE x | 0.44 | 1.0 | 0.44310 | 0.0031020 |
| CIE y | 0.40 | 1.0 | 0.40368 | 0.0036762 |
| General CQS | 100 | 0.001 | 88.371 | −11.629 |
| Lumens | 1,049.4 | 0.00001 | 1,123.9 | 74.469 |
| General CRI | 73.681 | 0.00001 | 90.006 | 16.325 |
| CCT | 2,923 | 0.00001 | 2,955.5 | 32.466 |

TABLE 8

| Parameter | Lower Bound | Upper Bound | Optimized value |
|---|---|---|---|
| Green phosphor density | 0.0001 | 100,000,000 | 3,672.2 |
| Red phosphor density | 0.0001 | 100,000,000 | 4,134.6 |
| Red LED central λ | 550 nm | 620 nm | 618.02 nm |
| Blue LED central λ | 450 nm | 480 nm | 462.42 nm |
| Red LED power | 0 watts | 3 watts | 0.77765 watts |
| Blue LED power | 0 watts | 3 watts | 0.43909 watts |

Reference Devices

For comparison purposes, alternative broadband light sources, referred to here as "reference devices", were also simulated. These sources were similar in construction to Examples 1 through 4, except for the following changes:

the dichroic reflector on the outer curved surface of each of the four plano-convex bodies 619 was replaced by an antireflective coating;

the hemispherical cover member was replaced with a first modified cover member of the same size and geometry, the first modified cover member having a uniform thickness of 0.1 mm, and being uniformly composed of one of the phosphor materials (phosphor particles in a matrix) used in layers 617 or 618. A second modified cover member, also hemispherical in shape and 0.1 mm in thickness, and whose outer diameter mated with the inner diameter of the first modified cover member, was incorporated inside the first modified cover member. The second modified cover member was uniformly composed of the other phosphor material from layers 617, 618. In other words, if the first modified cover member was composed of the red-emitting phosphor material of layer 618, then the second modified cover member was composed of the green-emitting phosphor material of layer 617, and vice versa.

In view of these changes, each subsystem previously known as a remote phosphor LED 611 was no longer itself a remote phosphor LED, because light from the LED 612 was no longer substantially reflected onto the phosphor layers 617, 618 to excite the phosphors. Further, the LEDs previously known as direct emitting LEDs 530*a*-*b*, 630*a*-*b* were no longer direct-emitting, because the light from these LEDs was now required to propagate through the phosphor materials in the modified cover members.

Reference Device 1

A first reference device was simulated using the same optical design software as before. This reference device was the same as Example 1 except for the changes noted above. The LEDs 612 had a peak wavelength of 445 nm. The first (outer) modified cover member was composed of the same red-emitting phosphor material used in layer 618, and the second (inner) modified cover member was composed of the same green-emitting phosphor material used in layer 617. Target values for the output parameters, and their respective weights in the merit function, were the same as those of Example 1 as shown below in Table 9.

Figure 13:
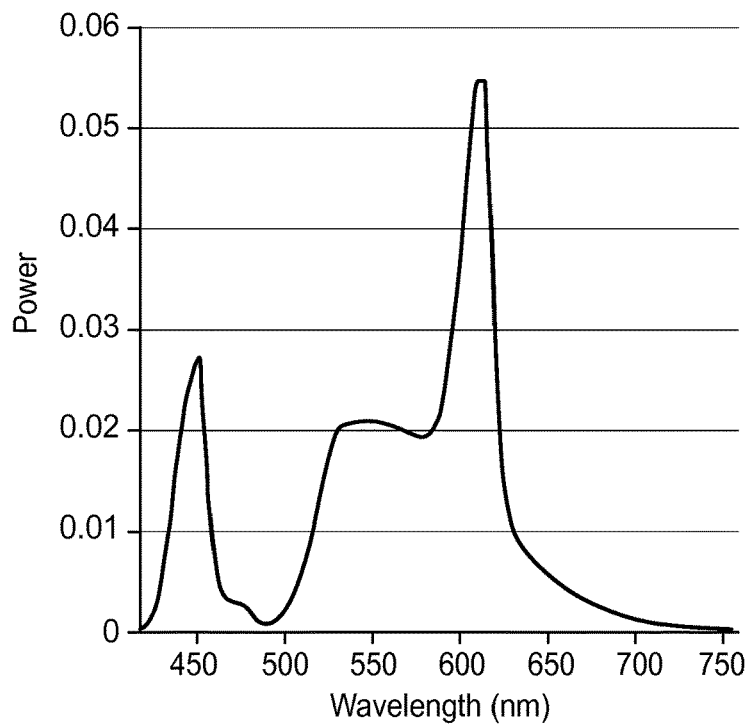
FIGS. 13-15 are graphs of spectral power output for three different simulated reference devices that provide broadband light.

The optical design software was again used to calculate optimized values for the output parameters, which are included in Table 9. Optimized values for the six independent variable design parameters were also calculated, and are shown in Table 10 below. The spectral power output in the same detector plane used in the above Examples was also calculated, assuming the optimized values for all of the respective parameters. This spectral power output for Reference Device 1 is shown in FIG. 13.

TABLE 9

| Parameter | Target value | Weight | Optimized value | Difference |
|---|---|---|---|---|
| Total power | 6.0 watts | 0.01 | 1.8379 watts | −4.1621 watts |
| CIE x | 0.44 | 1.0 | 0.43475 | −0.0052465 |
| CIE y | 0.40 | 1.0 | 0.40303 | 0.0030267 |
| General CQS | 100 | 0.001 | 66.448 | −33.552 |
| Lumens | 1,049.4 | 0.00001 | 1,088.8 | 39.370 |
| General CRI | 73.681 | 0.00001 | 70.574 | −3.1070 |
| CCT | 2,923 | 0.00001 | 3,055.5 | 132.48 |

TABLE 10

| Parameter | Lower Bound | Upper Bound | Optimized value |
|---|---|---|---|
| Green phosphor density | 0.0001 | 100,000,000 | 11,588 |
| Red phosphor density | 0.0001 | 100,000,000 | 846.43 |
| Red LED central λ | 550 nm | 620 nm | 605.08 nm |
| Blue LED central λ | 450 nm | 480 nm | 472.40 nm |
| Red LED power | 0 watts | 3 watts | 0.93259 watts |
| Blue LED power | 0 watts | 3 watts | 0.41854 watts |

Reference Device 2

A second Reference Device was then simulated using the optical design software. This Reference Device 2 was the same as Reference Device 1, except that the phosphor materials used in the modified cover members was reversed. Thus, the first (outer) modified cover member was composed of the same green-emitting phosphor material used in layer 617, and the second (inner) modified cover member was composed of the same red-emitting phosphor material used in layer 618. Target values for the output parameters, and their respective weights in the merit function, were the same, as shown below in Table 11.

Figure 14:
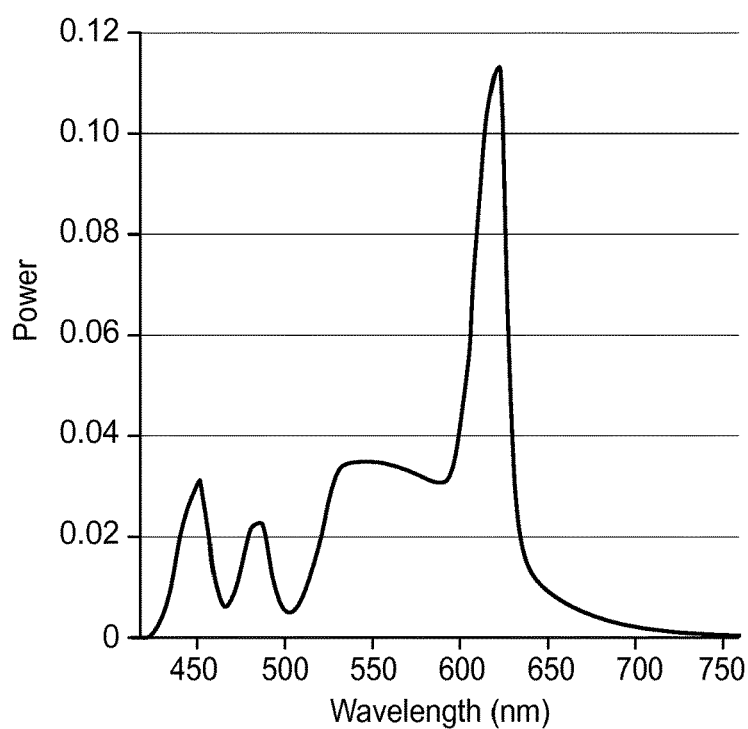

The optical design software again calculated optimized values for the output parameters, which are included in Table 11. Optimized values for the six independent variable design parameters were also calculated, and are shown in Table 12 below. The spectral power output in the specified detector plane was also calculated, assuming the optimized values for all of the respective parameters. This spectral power output for Reference Device 2 is shown in FIG. 14.

TABLE 11

| Parameter | Target value | Weight | Optimized value | Difference |
|---|---|---|---|---|
| Total power | 6.0 watts | 0.01 | 3.0161 watts | −2.9839 watts |
| CIE x | 0.44 | 1.0 | 0.44 | −0.0000024 |
| CIE y | 0.40 | 1.0 | 0.39231 | −0.0076922 |
| General CQS | 100 | 0.001 | 83.0 | −17.0 |
| Lumens | 1,049.4 | 0.00001 | 1,938.4 | 888.92 |
| General CRI | 73.681 | 0.00001 | 85.582 | 11.901 |
| CCT | 2,923 | 0.00001 | 2,843.8 | −79.187 |

TABLE 12

| Parameter | Lower Bound | Upper Bound | Optimized value |
|---|---|---|---|
| Green phosphor density | 0.0001 | 100,000,000 | 12,067 |
| Red phosphor density | 0.0001 | 100,000,000 | 264.62 |
| Red LED central λ | 550 nm | 620 nm | 611.26 nm |
| Blue LED central λ | 450 nm | 480 nm | 479.79 nm |
| Red LED power | 0 watts | 3 watts | 2.1350 watts |
| Blue LED power | 0 watts | 3 watts | 2.8104 watts |

Reference Device 3

A third Reference Device was then simulated using the optical design software. This Reference Device 3 was the same as Reference Device 2, except that the LEDs 612 had peak wavelengths of 415 nm rather than 445 nm. Target values for the output parameters, and their respective weights in the merit function, were the same as those of Reference Device 2 as shown below in Table 13.

Figure 15:
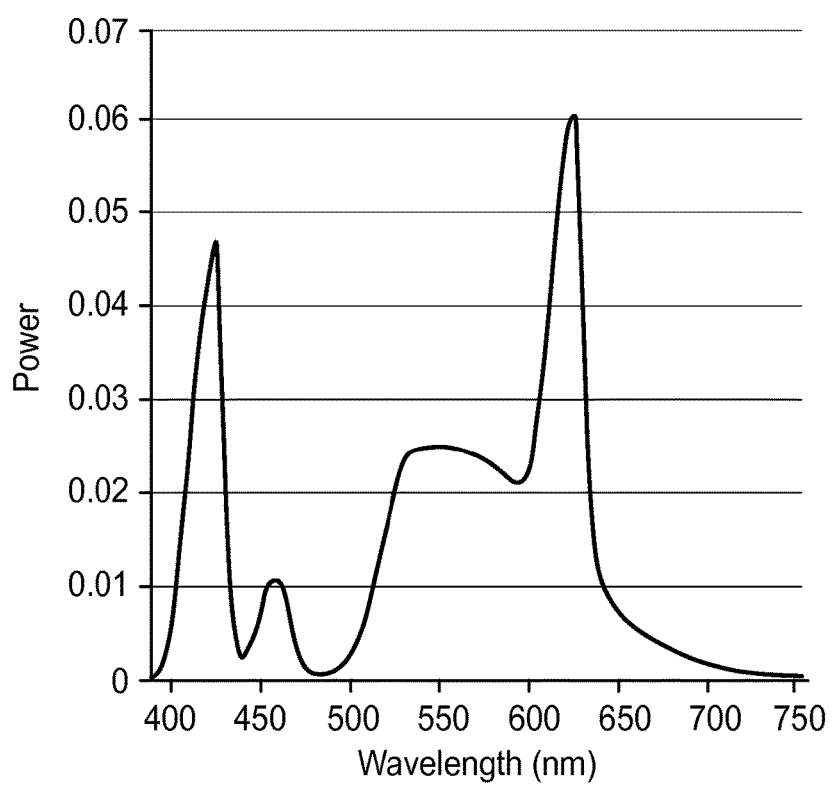

The optical design software again calculated optimized values for the output parameters, which are included in Table 13. Optimized values for the six independent variable design parameters were also calculated, and are shown in Table 14 below. The spectral power output in the specified detector plane was also calculated, assuming the optimized values for all of the respective parameters. This spectral power output for Reference Device 3 is shown in FIG. 15.

TABLE 13

| Parameter | Target value | Weight | Optimized value | Difference |
|---|---|---|---|---|
| Total power | 6.0 watts | 0.01 | 2.2971 watts | −3.7029 watts |
| CIE x | 0.44 | 1.0 | 0.43101 | −0.0089937 |
| CIE y | 0.40 | 1.0 | 0.40362 | 0.0036221 |
| General CQS | 100 | 0.001 | 77.746 | −22.254 |
| Lumens | 1,049.4 | 0.00001 | 1,258.3 | 208.84 |
| General CRI | 73.681 | 0.00001 | 80.198 | 6.5171 |
| CCT | 2,923 | 0.00001 | 3,034.5 | 111.52 |

TABLE 14

| Parameter | Lower Bound | Upper Bound | Optimized value |
|---|---|---|---|
| Green phosphor density | 0.0001 | 100,000,000 | 8,827.1 |
| Red phosphor density | 0.0001 | 100,000,000 | 1,871.1 |
| Red LED central λ | 550 nm | 620 nm | 615.95 nm |
| Blue LED central λ | 450 nm | 480 nm | 455.24 nm |
| Red LED power | 0 watts | 3 watts | 1.0429 watts |
| Blue LED power | 0 watts | 3 watts | 0.99711 watts |

Further Discussion

By virtue of the relatively small size of the remote phosphor LEDs used in the Examples, in comparison to the larger modified cover members of the Reference Devices, the amount of red-emitting and green-emitting phosphor used in the Examples is significantly less than that used in the Reference Devices.

We may quantify the amount of phosphor material used in terms of the area of the major surface of the phosphor upon which light is incident. For example, in the embodiment of FIG. 6a, the phosphor layer 614 shares an interface with layer 615, this shared interface coinciding with the major surface (i.e., surface of largest surface area) of the phosphor layer 614 upon which excitation light is incident. If we ignore for simplicity or approximation the volume or area taken up by the LED 612 and assume that the phosphor layer 614 is continuous and coextensive with the planar surface of body 619, then the area of the incident major surface of the phosphor layer 614 is about 12.6 mm². Since four of the remote phosphor LEDs are included in the broadband light source, the total or collective phosphor surface area, which we may refer to as Aphosphor, is about 50 mm². Thus, the collective surface area of phosphor layers in the light source upon which excitation light is incident, or, more simply, the collective phosphor surface area, or Aphosphor, is about 50 mm² for each of Examples 1 through 4. If desired, this amount of phosphor can be significantly reduced even further, because, due to the focusing properties of the concave dichroic reflector and the placement of the pump LED, the phosphor layer can be patterned to cover only a fraction of the size of the planar surface of body 619, with little or no reduction or change in the output light of the light source. For example, the collective phosphor surface area Aphosphor may be reduced from 50 to at least 20 or even 10 mm², with little or no reduction or change in output light.

In contrast, the amount of phosphor used in the Reference Devices is significantly greater. The surface area of the combined modified cover members upon which pump light is incident is at least about that of a hemisphere of radius 10 mm, or at least about 628 mm². This ignores the much smaller surface area of phosphor layers which remain at the base of the body 619, which smaller phosphor layers may be omitted from the Reference Devices with little or no reduction or change in output light.

For generality, the amount of phosphor may also be expressed as a ratio, in terms of the collective phosphor surface area divided by the collective emitting surface area of all pump LEDs in the light source. In the case of Examples 1-4, four pump LEDs 612 were used, each of these having a major emitting surface area of 1 mm². The collective pump LED surface area, which we may refer to as ALED, is then 4 mm². The ratio of Aphosphor to ALED, in each of the Examples 1-4, is 50/4 z 10. If the collective phosphor surface area Aphosphor is reduced to 20 or 10 mm² by patterning as described above, with no reduction in LED emitting surface area, the ratio of Aphosphor/ALED is concomitantly reduced to 20/4≈5, or 10/4≈2.

In contrast, the ratio of Aphosphor to ALED in the Reference Devices is at least 628/6≈105, where we include in the denominator not only the major emitting surface areas of the LEDs 612 but also those of the LED 530a/630a and the LED 530b/630b since light from these LEDs is required to propagate through the phosphor materials in the (phosphor-filled) modified cover members.

Preferably, the ratio Aphosphor/ALED for the disclosed broadband light sources, which utilize at least one remote phosphor LED and at least one direct emitting LED, is no greater than 50, or 20, or 15, or 10, or 5, or 2.

Example 1, Reference Device 1, and Reference Device 2 each had a target output color of (0.44, 0.40) for the x, y color coordinates, and each also used the 445 nm peak wavelength LEDs as the four LEDs 612. The various optimized output parameters for these three embodiments, as well as the collective phosphor surface area Aphosphor as described above, are compared in Table 15. Also compared is a ratio, referred to as "lm/Radiant W", of the total lumen output detected by the receiver divided by the total radiant power (in watts) of light emitted by the remote phosphor and the direct emitting LEDs.

TABLE 15

| Optimized Output Parameter | Example 1 | Ref. Dev. 1 | Ref. Dev. 2 |
|---|---|---|---|
| lm/Radiant W | 195 | 196 | 217 |
| CCT | 3,028 | 3,056 | 2,843 |
| CIE x | 0.441 | 0.435 | 0.440 |
| CIE y | 0.398 | 0.403 | 0.392 |
| General CRI | 81.1 | 70.6 | 85.6 |
| General CQS | 79 | 66.5 | 83 |
| Aphosphor (mm²) | 50 | at least 628 | at least 628 |

Example 4 and Reference Device 3 each had a target output color of (0.44, 0.40) for the x, y color coordinates, and each also used the 415 nm peak wavelength LEDs as the four LEDs 612. The various optimized output parameters for these three embodiments are compared in Table 16.

TABLE 16

| Optimized Output Parameter | Example 4 | Ref. Dev. 3 |
|---|---|---|
| lm/Radiant W | 215 | 208.2 |
| CCT | 2,955 | 3,034.5 |
| CIE x | 0.443 | 0.431 |
| CIE y | 0.404 | 0.404 |
| General CRI | 90 | 80.2 |
| General CQS | 88.4 | 77.8 |
| Aphosphor (mm²) | 50 | at least 628 |

Tables 15 and 16, and the simulation results above, demonstrate that the disclosed broadband light sources, which utilize at least one remote phosphor LED and at least one direct emitting LED, can provide broadband white light with suitable values for CCT, CRI, CQS, and, while utilizing substantially reduced amounts of phosphor. The direct emitting LED may include a blue-light emitting LED. By supplying blue light directly from direct emitting LED(s) rather than (or in addition to) blue light transmitted by pump LED(s) e.g. through the dichroic reflector(s), we can improve the combined performance of the bulb's luminous efficacy and color quality.

Unless otherwise indicated, all numbers expressing quantities, measurement of properties, and so forth used in the specification and claims are to be understood as being modified by the term "about". Accordingly, unless indicated to the contrary, the numerical parameters set forth in the specification and claims are approximations that can vary depending on the desired properties sought to be obtained by those skilled in the art utilizing the teachings of the present application. Not as an attempt to limit the application of the doctrine of equivalents to the scope of the claims, each numerical parameter should at least be construed in light of the number of reported significant digits and by applying ordinary rounding techniques. Notwithstanding that the numerical ranges and parameters setting forth the broad scope of the invention are approximations, to the extent any numerical values are set forth in specific examples described herein, they are reported as precisely as reasonably possible. Any numerical value, however, may well contain errors associated with testing or measurement limitations.

Various modifications and alterations of this invention will be apparent to those skilled in the art without departing from the spirit and scope of this invention, and it should be understood that this invention is not limited to the illustrative embodiments set forth herein. For example, the disclosed transparent conductive articles may also include an anti-reflective coating and/or a protective hard coat. The reader should assume that features of one disclosed embodiment can also be applied to all other disclosed embodiments unless otherwise indicated. It should also be understood that all U.S. patents, patent application publications, and other patent and non-patent documents referred to herein are incorporated by reference, to the extent they do not contradict the foregoing disclosure.

The invention claimed is:

1. A light source for emitting broadband output light, comprising:
   a base;
   a light-transmissive cover member attached to the base; and
   a first pump LED, a second non-pump LED, a first phosphor layer, and a first dichroic reflector carried by the base and covered by the cover member, wherein:
      the first pump LED, the first phosphor layer, and the first dichroic reflector are arranged such that the first phosphor layer is structurally separated from the first pump LED,
      at least some excitation light emitted by the first pump LED propagates from the first pump LED to the first dichroic reflector without passing through the first phosphor layer,
      the first dichroic reflector is configured to reflect at least some excitation light from the first pump LED onto the first phosphor layer to cause the first phosphor layer to emit first phosphor light, the first dichroic reflector is also configured to substantially transmit the first phosphor light, and
      the second non-pump LED is disposed to emit substantially all light that propagates from the second non-pump LED to the cover member without passing through any dichroic reflector including the first dichroic reflector.

2. The source of claim 1, wherein light emitted by the light source is substantially white.

3. The source of claim 1, wherein the first pump LED emits light having a peak wavelength from 340 to 480 nm.

4. The source of claim 1, wherein the first pump LED emits light having a peak wavelength from 400 to 470 nm.

5. The source of claim 1, wherein the second non-pump LED is one of a plurality of non-pump LEDs.

6. The source of claim 5, wherein the plurality of non-pump LEDs include a blue-emitting LED having a peak wavelength in a range from 445 to 500 nm, and a red-emitting LED having a peak wavelength in a range from 600 to 650 nm.

7. The source of claim 1, further comprising:
   a controller configured to control the first pump and second non-pump LEDs with first and second drive signals respectively.

8. The source of claim 1, wherein the cover member is light-diffusing.

9. The source of claim 1, wherein the first dichroic reflector is concave and covers both the first pump LED and the first phosphor layer.

10. The source of claim 1, wherein the cover member is concave.

11. The source of claim 1, wherein light emitted by the light source is substantially white and has a color rendering index of at least 80.

12. The source of claim 1, wherein the first pump LED is one of a plurality of pump LEDs.

13. The source of claim 12, wherein the first phosphor layer is one of a plurality of phosphor layers, and wherein the first dichroic reflector is one of a plurality of dichroic reflectors, each of the dichroic reflectors configured to reflect excitation light from at least one of the plurality of pump LEDs onto a corresponding one of the phosphor layers.

14. The source of claim 12, wherein the plurality of pump LEDs each have a major emitting surface with a major emitting surface area, a sum of the major emitting surface areas being a collective LED surface area ALED, and wherein the phosphor layers each have a major surface upon which light is incident, a sum of the phosphor incident surface areas being a collective phosphor surface area Aphosphor, and wherein Aphosphor/ALED, is no more than 10.

15. The source of claim 1, wherein the first phosphor layer comprises a patterned phosphor having two or more phosphors of differing emission bands.

16. A method, comprising:
   providing a first pump LED, a second non-pump LED, and a first phosphor layer;
   arranging a first dichroic reflector to intercept at least some excitation light from the first pump LED, and to reflect such excitation light onto the first phosphor layer to cause the first phosphor layer to emit first phosphor light, wherein:
      the first pump LED, the first phosphor layer, and the first dichroic reflector are arranged such that the first phosphor layer is structurally separated from the first pump LED, and
      at least some excitation light propagates from the first pump LED to the first dichroic reflector without passing through the first phosphor layer;
   substantially transmitting the first phosphor light through the first dichroic reflector; and
   combining the first phosphor light transmitted through the first dichroic reflector with substantially all LED light emitted by the second non-pump LED that has not passed through any dichroic reflector including the first dichroic reflector, to provide broadband output light.

17. The method of claim 16, wherein the providing includes providing a plurality of pump LEDs, the plurality of pump LEDs including the first pump LED and a third pump LED.

18. The method of claim 17, wherein the first dichroic reflector is also arranged to intercept at least some excitation light from the third pump LED, and to reflect such excitation light onto the first phosphor layer to cause the first phosphor layer to emit more of the first phosphor light.

19. The method of claim 17, wherein the providing further includes providing a second phosphor layer, the method further comprising:
   arranging a second dichroic reflector to intercept at least some excitation light from the third pump LED, and to reflect such excitation light onto the second phosphor layer to cause the second phosphor layer to emit second phosphor light;
   wherein the combining includes combining the second phosphor light transmitted through the second dichroic reflector with the first phosphor light transmitted through the first dichroic reflector and with substantially all the LED light emitted by the second non-pump LED that has not passed through any dichroic reflector, to provide the broadband output light.

* * * * *

UNITED STATES PATENT AND TRADEMARK OFFICE
CERTIFICATE OF CORRECTION

PATENT NO. : 10,077,886 B2
APPLICATION NO. : 14/402039
DATED : September 18, 2018
INVENTOR(S) : Ouderkirk et al.

It is certified that error appears in the above-identified patent and that said Letters Patent is hereby corrected as shown below:

In the Specification

Column 19,
Line 3, delete "/Tio2" and insert -- /TiO$_2$ -- therefor.

Column 25,
Line 41, delete "50/4 z 10" and insert -- 50/4 $\approx$ 10 -- therefor.

Signed and Sealed this
Twenty-second Day of January, 2019

Andrei Iancu
*Director of the United States Patent and Trademark Office*